（12）United States Patent
Yabuuchi et al.

(10) Patent No.: US 8,018,785 B2
(45) Date of Patent: *Sep. 13, 2011

(54) SEMICONDUCTOR MEMORY DEVICE COMPRISING A PLURALITY OF STATIC MEMORY CELLS

(75) Inventors: Makoto Yabuuchi, Tokyo (JP); Koji Nii, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/909,465

(22) Filed: Oct. 21, 2010

(65) Prior Publication Data

US 2011/0032750 A1  Feb. 10, 2011

Related U.S. Application Data

(63) Continuation of application No. 12/555,447, filed on Sep. 8, 2009, now Pat. No. 7,876,625, which is a continuation of application No. 11/889,145, filed on Aug. 9, 2007, now Pat. No. 7,602,654.

(30) Foreign Application Priority Data

Aug. 10, 2006  (JP) .................................. 2006-218514
May 10, 2007  (JP) .................................. 2007-125798

(51) Int. Cl.
*G11C 7/00* (2006.01)
(52) U.S. Cl. ............... 365/189.11; 365/226; 365/230.06
(58) Field of Classification Search ............. 365/189.11, 365/226, 230.03, 230.06
See application file for complete search history.

(56) References Cited

U.S. PATENT DOCUMENTS 6,212,124 B1   4/2001  Noda
(Continued)

FOREIGN PATENT DOCUMENTS

JP  2000-298986  10/2000
(Continued)

OTHER PUBLICATIONS

Zhang, K. et al., "A 3-GHz 70Mb SRAM in 65nm CMOS Technology with Integrated Column-Based Dynamic Power Supply," ISSCC 2005, Session 26, IEEE International Solid State Circuits Conference.

(Continued)

*Primary Examiner* — Richard Elms
*Assistant Examiner* — Hien N Nguyen
(74) *Attorney, Agent, or Firm* — McDermott Will & Emery LLP

(57) ABSTRACT

A driver power supply circuit stepping down a power supply voltage is arranged at a power supply node of a word line driver. The driver power supply circuit includes a non-silicide resistance element of N+ doped polycrystalline silicon, and a pull-down circuit lowering a voltage level of the driver power supply node. The pull-down circuit includes a pull-down transistor having the same threshold voltage characteristics as a memory cell transistor pulling down a voltage level of the driver power supply node, and a gate control circuit adjusting at least a gate voltage of the pull-down transistor. The gate control circuit corrects the gate potential of the pull-down transistor in a manner linked to variations in threshold voltage of the memory cell transistor.

6 Claims, 23 Drawing Sheets

U.S. PATENT DOCUMENTS

| | | |
|---|---|---|
| 6,873,562 B2 | 3/2005 | Koelling et al. |
| 7,085,175 B2 | 8/2006 | Remington et al. |
| 7,206,238 B2 | 4/2007 | Kliewer et al. |
| 7,310,279 B2 | 12/2007 | Takahashi et al. |
| 7,474,553 B2 | 1/2009 | Salters |
| 7,602,654 B2 | 10/2009 | Yabuuchi et al. |
| 2007/0030741 A1 | 2/2007 | Nii et al. |
| 2008/0279017 A1 | 11/2008 | Shimano et al. |
| 2009/0323398 A1* | 12/2009 | Yabuuchi et al. ............. 365/148 |

FOREIGN PATENT DOCUMENTS

JP  2005-038557  2/2005

OTHER PUBLICATIONS

Yamaoka, M. et al., "Low-Power Embedded SRAM Modules with Expanded Margins for Writing," ISCC 2005, Session 26, IEEE International Solid-State Circuits Conference.

Zhang, K. et al., "SRAM Designed on 65-nm CMOS Technology With Dynamic Sleep Transistor for Leakage Reduction," Journal of Solid-State Circuits, vol. 40, No. 4, IEEE, Apr. 2005.

Yamaoka, M. et al., "A 300-MHz 25-µA/Mb-Leakage On-Chip SRAM Module Featuring Process-Variation Immunity and Low-Leakage-Active Mode for Mobile-Phone Application Processor," Journal of Solid-State Circuits, vol. 40, No. 1, IEEE, Jan. 2005.

* cited by examiner

26: SIMILAR TO 20 HAVING INTERCONNECTION WIDTH EQUAL TO GATE LENGTH OF CELL TRANSISTOR

28: HAVING THE SAME WIDTH AS DIFFUSION LAYER OF CELL TRANSISTOR

IMP3
W
28

IL
26
L

IMP2  G  IMP1
W
L  MTR

EQUAL IN W

EQUAL IN L

26: SIMILAR TO 20 HAVING INTERCONNECTION WIDTH EQUAL TO GATE LENGTH OF CELL TRANSISTOR

26: SIMILAR TO 20 HAVING INTERCONNECTION WIDTH EQUAL TO GATE LENGTH OF CELL TRANSISTOR

| MODE | P1 | P2 | XL | DETAILS |
|---|---|---|---|---|
| MODE_A | L | H | FIXED AT H | VG: FIXED AT L<br>VDDR=VDD |
| MODE_B | H | L | FIXED AT L | VG: FIXED AT H<br>VDDR<VDD |
| MODE_C | H | H | SELECTED: L | VG<VCC |
|  |  |  | UNSELECTED: H | VG: L |

SEMICONDUCTOR MEMORY DEVICE COMPRISING A PLURALITY OF STATIC MEMORY CELLS

RELATED APPLICATIONS

This application is a Continuation of U.S. patent application Ser. No. 12/555,447, filed on Sep. 8, 2009, now U.S. Pat. No. 7,876,625 which is a Continuation of U.S. patent application Ser. No. 11/889,145, filed on Aug. 9, 2007, now U.S. Pat. No. 7,602,654 claiming priority of Japanese Patent Application Nos. 2006-218514, filed on Aug. 10, 2006, and 2007-125798, filed on May 10, 2007, the entire contents of each of which are hereby incorporated by reference.

BACKGROUND OF THE INVENTION

1. Field of the Invention

The present invention relates to a semiconductor memory device, and particularly to a structure of a static semiconductor memory device that allows stable writing and reading of data even under operation conditions of a low voltage.

2. Description of the Background Art

When transistor elements are miniaturized according to the progression of miniaturization technologies, voltage scaling depending on the miniaturization is required in view of reliability of the elements and power consumption. As the miniaturization is performed, an influence of variations in manufacturing parameter increases, and causes large variations in threshold voltage of transistors (i.e., insulated gate field-effect transistors to be referred to as "MOS transistors" hereinafter) that form a memory cell. Consequently, it becomes difficult in a semiconductor memory device to perform stable writing and reading of data with a low power supply voltage.

Various structures have been proposed for stably writing and reading data even with such a low power supply voltage.

An article 1 (K. Zhang et al., "A 3-GHz 70 Mb SRAM in 65=CMOS Technology with Integrated Column-Based Dynamic Power Supply", ISSCC 2005, Digest of Technical Papers, February 2005, pp. 474-475) has disclosed a structure which switches a level of a memory cell power supply voltage between those for data reading and data reading, and thereby improves a static noise margin SNM and a write margin.

In this article 1, a memory cell power supply voltage is controlled a memory cell column at a time. In a data write operation, the memory cell power supply voltage in a selected column is set to a low voltage VCC-LO, and the cell power supply voltage in unselected columns is set to a slightly high voltage VCC-HI that is substantially equal to that in a read operation. In the read operation, the cell power supply voltage is kept at high voltage VCC-HI so that a static noise margin in the data read operation is improved. Also, in the write operation, the memory cell power supply voltage is set to low voltage VCC-LO so that a write margin is ensured.

An article 2 (M. Yamaoka et al., "Low-Power Embedded SRAM Modules with Expanded Margins for Writing", ISSCC 2005, Digest of Technical Papers, February 2005, pp. 480-481) has disclosed a structure that sets a memory cell power supply line in a selected column to a floating state in a data write operation, and sets memory cell power supply lines in the other, i.e., unselected columns to a predetermined voltage level similar to that in a read operation. This article 2 has also disclosed a structure that uses a dummy bit line to produce a word line deactivation timing signal WOFF according to a potential of this dummy bit line, and thereby deactivates a word line driver to drive a selected word line to an unselected state.

In the structure disclosed in this article 2, each word line is provided with a discharge transistor (i.e., a transistor for discharging) that sets the word line to a ground voltage level and is independent of a word line driver. This discharge transistor stays off during a standby state. When a selected word line is to be driven to an inactive state, the discharge transistor rapidly drives the word line to the unselected state by its large current drive power. After it drives the word line to the unselected state, a power supply to this word line driver is interrupted so that a gate potential of the discharge transistor attains the L-level according to the driver power supply voltage to turn off the discharge transistor.

A publication 1 (Japanese Patent Laying-Open No. 2005-038557) has disclosed a structure in which a level changing circuit is used in a word line driver, and a selected word line is driven with a voltage amplitude different from that of a memory cell power supply voltage. By changing the potential of the selected word line, it is intended to improve write and read margins even when variations occur in threshold voltage of a memory cell transistor.

In the structure disclosed in the article 1, switching of the level of the memory cell power supply voltage is controlled a memory cell column at a time. Therefore, two kinds of voltages are required as the memory cell power supply voltage, which results in a problem that a structure achieving the two kinds of power supplies becomes complicated.

Although the memory cell power supply voltage is switchable between different levels, these voltage levels are fixed potentials produced by an internal power supply circuit. Therefore, even when a threshold voltage of the memory cell transistor varies due to variations in process parameter, the voltage level does not change according to such variations, and it is difficult to compensate for the changes in threshold voltage. Therefore, it is difficult to ensure reliably the write and read margins when changes or the like occur in electric characteristics such as a threshold voltage of the memory cell transistor.

In the structure disclosed in the article 2, the memory cell power supply line in the selected column attains the floating state in the data write operation, and lowers the power supply voltage of the memory cells in the write column so that the write margin may be ensured. Although this article 2 has disclosed the improvement of the write margin and the reduction of the power supply current, any consideration is given to a method of improving the read margin when variations occur in threshold voltage of the memory cell transistor.

In the structure disclosed in the reference 1, the memory cell transistor is formed of a Thin Film Transistor (TFT). Even when the threshold voltage thereof varies, the level changing circuit changes a potential amplitude of the selected word line for improving the write and read margins. More specifically, in the data write operation, the structure in this reference 1 drives the selected word line to a potential level higher than the memory cell power supply potential, and thereby increases a current drive power of an access transistor in the memory cell so that fast writing may be performed and the write margin may be ensured. In the data read operation, the structure drives the selected word line to a voltage level lower than a high-side power supply voltage of the memory cell. Since the gate potential of the access transistor in the memory cell lowers, the current drive power lowers, and thereby the static noise margin is ensured so that data destruction may be prevented in the data read operation.

In the structure disclosed in this publication 1, however, the level changing circuit is supplied with an operation power supply voltage from a system different from that for the memory cell power supply voltage, and the shifted voltage level thereof is fixed and is not affected by the threshold voltage of the memory cell. In the reference 1, it is necessary to employ a system of the power supply for the level shifting independent of that of the memory cell power supply so that the power supply systems have a complicated structure. Although the level of the potential of the selected word line is shifted, the voltage level thereof is fixed, and it cannot flexibly follow the variations in threshold voltage of the memory cell transistor.

In the reference 1, the selected word line is driven to the voltage level higher than that of the memory cell power supply in the data write operation, and no consideration is given to the stability of the data in unselected memory cells connected to the selected row in the data write operation.

In the semiconductor memory device, when an operation environment (operation temperature) changes, characteristics of the memory cell transistor changes with it. Therefore, from the viewpoint of reliably ensuring the write and read margins, it is desired to set the voltage level of the selected word line to the optimum value depending on operation environments such as an operation temperature. In the foregoing reference 1 and articles 1 and 2, however, such a structure is neither disclosed nor suggested that reliably adjusts the selected word line according to variations in threshold voltage of the transistor in the memory cell when the foregoing operation environment changes.

SUMMARY OF THE INVENTION

An object of the invention is to provide a semiconductor memory device that has a simple circuit structure, and allows stable writing and reading of data even with a lower power supply voltage.

Another object of the invention is to provide a semiconductor memory device that adjusts the selected word line potential in a manner flexibly following variations in threshold voltage of the memory cell transistor, and thereby can ensure write and read margins even with a low power supply voltage.

Still another object of the invention is to provide a semiconductor memory device that sets a word line potential to an optimum value depending on variations in threshold voltage of the memory cell transistor independently of an operation temperature, and thereby can ensure write and read margins.

A semiconductor memory device according to the invention includes a plurality of static memory cells arranged in rows and columns; a plurality of word lines arranged corresponding to the respective memory cell rows and each connected to the memory cells in the corresponding row; a plurality of word line drivers arranged corresponding to the respective word lines, and each driving the corresponding word line to a selected state when the corresponding word line is address-designated; and a driver power supply circuit stepping down a voltage on a main power supply node and supplying the stepped-down voltage to a driver power supply node of the word line driver. The driver power supply circuit has a resistance element connected between the main power supply node and the driver power supply node, and a pull-down circuit pulling down the voltage on the driver power supply node. The resistance element is formed of a passive element.

In this semiconductor memory device according to the invention, the resistance element which is the passive element and the pull-down element set the voltage on the power supply node of the word line driver. Therefore, the potential of selected word line can be low in the read operation, and a conductance of an access transistor in the memory cell can be reduced so that a static memory margin in the read operation can be improved.

The device simply uses the resistance element which is the passive element and the pull-down circuit, and does not require the power supply for the level changing so that a power supply structure can be simple. Since the resistance element which is the passive element is used, a resistance value of the resistance element slightly increases when its temperature increases, but the resistance element has temperature characteristics that have an extremely low sensitivity to the temperature. Therefore, the potential change of the word line with respect to the temperature change is very small, and the pull-down circuit can be configured to follow only the changes in threshold voltage of the memory cell transistor. More specifically, the pull-down element is formed of a transistor similar to the memory cell transistor. Thereby, the voltage level of the word line can be adjusted according to the variations in threshold voltage of the memory cell transistor. When the pull-down element is formed of an N-channel MOS transistor, and particularly is at a low temperature, a threshold voltage Vth is high, but a mobility is also high so that a value of a current flowing through the N-channel MOS transistor for the pull-down does not change to a large extent. Conversely, when the temperature is high, threshold voltage Vth of the N-channel MOS transistor lowers, and the mobility also lowers so that the current hardly changes similarly to the above. Accordingly, the temperature dependence of the potential of selected word line can be eliminated, and the potential of selected word line can be set to an optimum value depending on the threshold voltage of the memory cell in a wide temperature range.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Whole Structure

Figure 1:
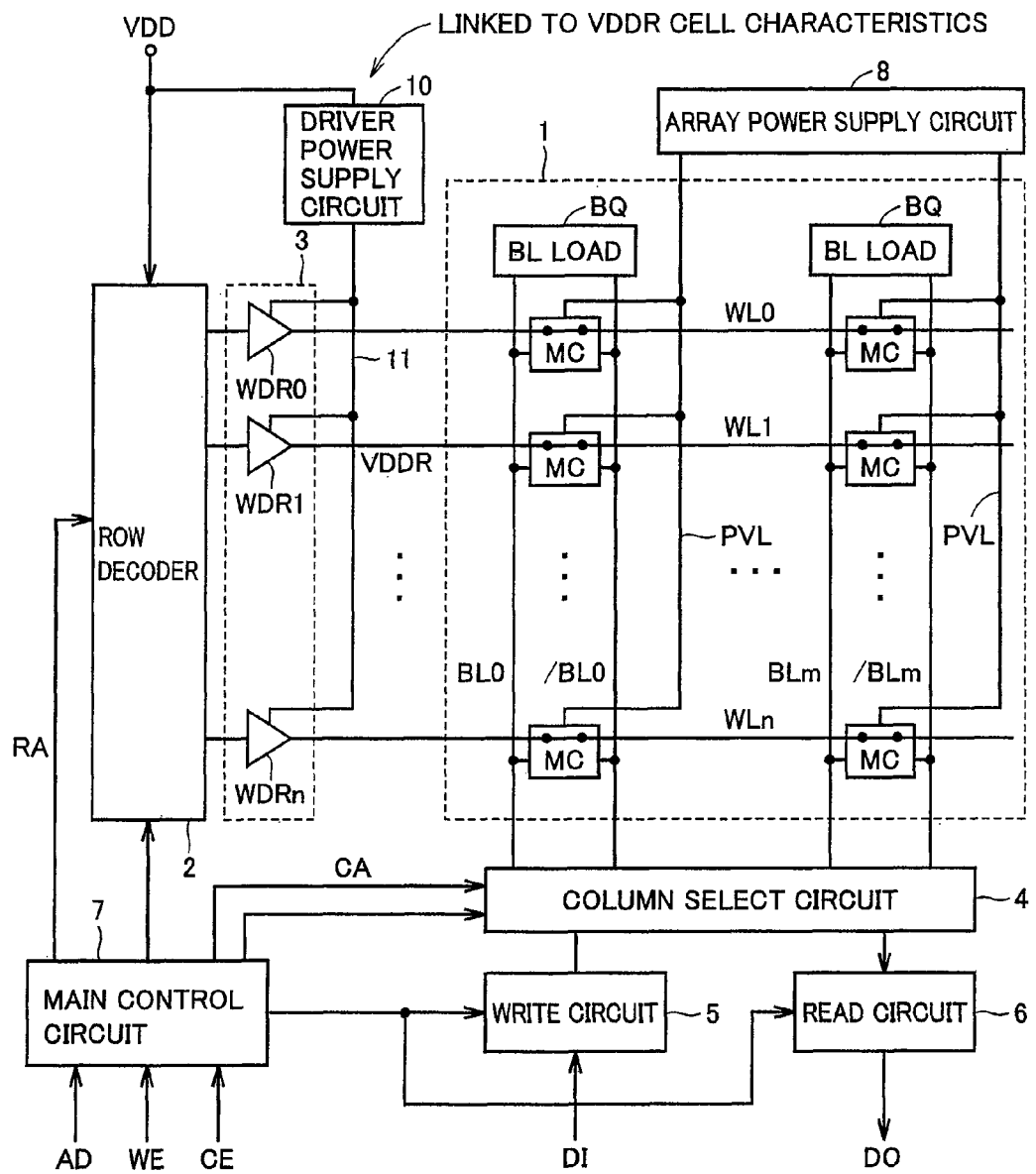
FIG. 1 schematically shows a whole structure of a semiconductor memory device according to the invention.

FIG. 1 schematically shows a whole structure of a semiconductor memory device according to the invention. The semiconductor memory device includes a memory cell array 1 having memory cells MC arranged in rows and columns. In an example of memory cell array 1 shown in FIG. 1, memory cells MC are arranged in (n+1) rows and (m+1) columns.

Word lines WL0-WLn are arranged corresponding to the respective rows of memory cells MC. Each memory cell MC is connected to the word line in the corresponding row. Bit line pairs BL0 and /BL0-BLm and /BLm are arranged corresponding to respective columns of memory cells MC. Each memory cell MC is a static memory cell as will be described later in details, and transmits complementary data to/from complementary bit line pair BLi and /BLi (i=0-m).

A bit line load (BL load) BQ is arranged corresponding to each of bit line pairs BL0 and /BL0-BLm and /BLm. This bit line load BQ pulls up the potential of the corresponding bit line in a data read operation, and supplies a column current to the corresponding bit line pair in the operation of reading memory cell data.

The semiconductor memory device further includes a row decoder 2 that produces a row select signal according to an internal row address signal RA, and a word line drive circuit 3 that drives the word line selected in memory array 1 to a selected state. Row decoder 2 receives a power supply voltage VDD as its operation power supply voltage, and decodes internal row address signal RA to produce a row select signal.

Word line drive circuit 3 includes word line drivers WDR0-WDRn that are arranged corresponding to word lines WL0-WLn, and drive the corresponding word lines according to the row select signal provided from row decoder 2, respectively. Each of word line drivers WDR0-WDRn receives a driver power supply voltage VDDR as its operation power supply voltage, and transmits a driver power supply voltage onto the corresponding word line when the corresponding word line is to be selected.

Driver power supply voltage VDDR is provided from a driver power supply circuit 10 having a structure to be described later in detail. Driver power supply circuit 10 shifts down the level of power supply voltage VDD to produce driver power supply voltage VDDR. Driver power supply circuit 10 adjusts the level of driver power supply voltage VDDR in a manner linked to the characteristics of the transistors included in memory cell MC. The relationship between the level of driver power supply voltage VDDR and the characteristics of the transistors in memory cell MC will be described later in detail.

The semiconductor memory device further includes a column select circuit 4 that selects the bit line pair corresponding to the selected column according to an internal column address signal CA, a write circuit 5 that transmits the write data to the bit line pair corresponding to the column selected by column select circuit 4 in the data write operation, a read circuit 6 that produces read data by sensing and, amplifying the data provided from the bit line pair corresponding to the column selected by column select circuit 4 in the data read operation, and a main control circuit 7 that produces internal row address signal RA, internal column address signal CA and control signals required for various operations according to an address signal AD, a write instructing signal WE and a chip enable signal CE that are externally applied.

This main control circuit 7 produces a word line activation timing signal, a column select timing signal and the like to define operation timing and operation sequences of row decoder 2 and column select circuit 4.

Write circuit 5 includes an input buffer and a write drive circuit, and produces an internal write data according to externally provided write data DI. Read circuit 6 includes a sense amplifier circuit and an output buffer. In the data read operation, the output buffer further buffers internal data sensed and amplified by the sense amplifier circuit to produce external read data DO.

An array power supply circuit 8 is further arranged for memory cell array 1. Array power supply circuit 8 supplies an array power supply voltage via cell power supply lines PVL to high-side power supply nodes of memory cells MC. In the structure shown in FIG. 1, cell power supply lines PVL are divided corresponding to the memory cell columns, respectively. Array power supply circuit 8 may be configured to supply the array power supply voltage commonly to cell power supply lines PVL. Cell power supply lines PVL may be configured to transmit low-side power supply voltages of the memory cells, or to transmit high- and low-side power supply voltages. The high-side power supply voltage is higher than the low-side power supply voltage.

The array power supply voltage supplied from array power supply circuit 8 in the standby state may be at the same voltage level as power supply voltage VDD that is supplied to driver power supply circuit 10 and row decoder 2, or may be different from it.

Figure 2:
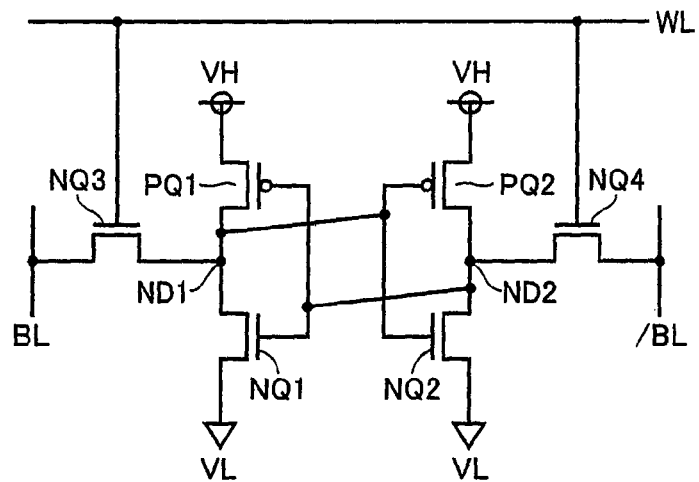
FIG. 2 shows by way of example a structure of a memory cell shown in FIG. 1.

FIG. 2 shows an example of the structure of memory cell MC shown in FIG. 1. In FIG. 2, memory cell MC has a structure of a full CMOS single-port SRAM cell. In FIG. 2, memory cell MC includes a P-channel MOS transistor PQ1 that is connected between a high-side power supply node VH and a storage node ND1, and has a gate connected to a storage node ND2, an N-channel MOS transistor NQ1 that is connected between storage node ND1 and a low-side power supply node VL, and has a gate connected to storage node ND2, a P-channel MOS transistor PQ2 that is connected between high-side power supply node VH and storage node ND2, and has a gate connected to storage node ND1, an N-channel MOS transistor NQ2 that is connected between storage node ND2 and low-side power supply node VL, and has a gate connected to storage node ND1, and N-channel MOS transistors NQ3 and NQ4 that couple storage nodes ND1 and ND2 to bit lines BL and /BL according to the voltage applied to word line WL, respectively.

Word line WL is one of word lines WL0-WLn shown in FIG. 1, and bit line pair BL and /BL is one of bit line pairs BL0 and /BL0-BLm and /BLm shown in FIG. 1.

In the structure of memory cell MC shown in FIG. 2, MOS transistors PQ1 and NQ1 form a CMOS inverter, and MOS transistors PQ2 and NQ2 form a CMOS inverter. These inverters have inputs and outputs that are cross-coupled to form an inverter latch (flip-flop). Storage nodes ND1 and ND2 hold complementary data. Margins in the operations of writing and reading data depend on the data holding capability of this inverter latch.

Figure 3:
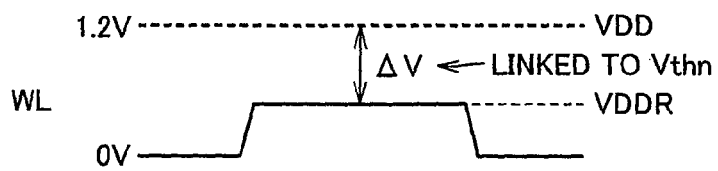
FIG. 3 illustrates a voltage level of a selected word line in the invention.

FIG. 3 illustrates an example of the voltage level of selected word line WL. In the example illustrated in FIG. 3, power supply voltage VDD is 1.2 V. Power supply voltage VDD is merely required to be low, and is not restricted to 1.2 V. When word line WL is to be selected, driver power supply voltage VDDR is transmitted onto it via corresponding word line driver WDR (one of WDR0-WDRn). A difference $\Delta V$ between power supply voltage VDD and driver power supply voltage VDDR changes in a manner linked to changes in threshold Vthn of N-channel MOS transistors NQ1-NQ4 included in memory cell MC. The voltage level of selected word line WL is set to a voltage level lower than power supply voltage VDD, whereby a read margin of the memory cell is ensured in the data read operation.

Figure 4:
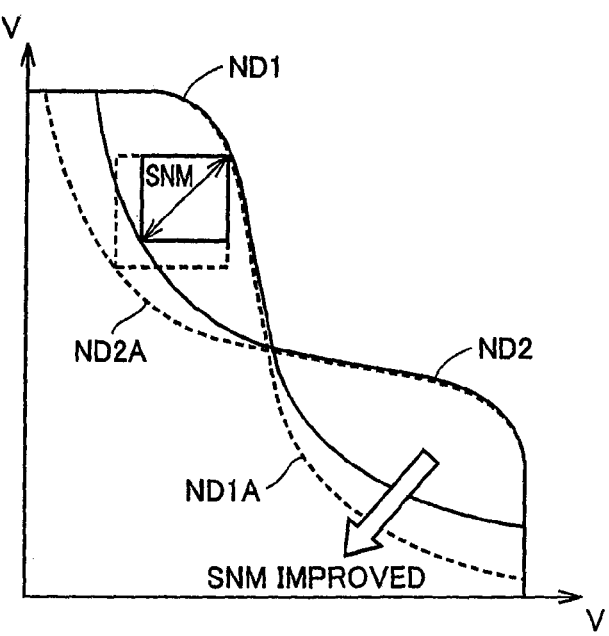
FIG. 4 illustrates a static noise margin of the memory cell.

FIG. 4 illustrates transmission characteristics of an inverter of memory cell MC. The transmission characteristics in FIG. 4 are input/output transmission characteristics of two CMOS inverters included in the memory cell. Curves ND1 and ND2 of solid line in FIG. 4 represent the transmission characteristics of storage nodes ND1 and ND2 exhibited when selected word line WL is at the level of power supply voltage VDD. A static noise margin SNM is represented by a diagonal of a solid-line square between curves ND1 and ND2 (or a diameter of an inscribed circle).

On the transmission characteristic curve illustrated in FIG. 4, when the threshold voltage of the load transistors (PQ1 and PQ2) in the memory cell increase in absolute value, an input logical threshold of the inverter in the memory cell shifts to a higher side. In this state, the current drive power of the load transistors (PQ1 and PQ2) decreases, and the current drive power of the access transistors (NQ3 and NQ4) may cause strong discharging of the output node of one inverter to destroy the held data. Therefore, the data holding characteristics deteriorate to reduce the width between transmission curves ND1 and ND2 of solid lines, and thus to reduce static noise margin SNM.

In this state, the voltage level of the selected word line is set via word line driver WDR to driver power supply voltage VDDR lower than power supply voltage VDD.

When the threshold voltages of drive transistors (NQ1 and NQ2) in the memory cell are low, the drive transistors have large current drive powers, and the potentials of high-side storage nodes in memory cell MC are liable to be discharged. In this case, the width between the transmission characteristic curves of storage nodes ND1 and ND2 decreases, and static noise margin SNM decreases. In this state, word line WL is set to the level of driver power supply voltage VDDR lower than power supply voltage VDD. This setting decreases conductances of access transistors (NQ3 and NQ4), and increases the resistances between storage nodes ND1 and ND2 and bit lines BL and /BL in the memory cell. Thereby, floating of the potentials of internal storage nodes ND1 and ND2 is suppressed (i.e., in the word line select operation, pull-up of the storage node by the access transistor becomes weak).

Therefore, as represented by curves ND2A and ND1A, discharging of the storage node voltage starts rapidly in response to a small change, and the width between the input/output transmission characteristic curves increases. Thus, static noise margin SNM increases. Therefore, a voltage step-down quantity $\Delta V$ is set in a manner linked to changes in threshold voltage of drive transistors (NQ1 and NQ2) and/or access transistors (NQ3 and NQ4) in the memory cell. Thereby, the conductance of the access transistor can be adjusted to increase the read margin so that the data reading can be performed stably.

When drive transistors NQ1 and NQ2 in the memory cell have large threshold voltages Vthn, these have small current drive powers and large on-resistances. In this case, therefore, voltage step-down quantity $\Delta V$ is decreased. In the state where drive transistors NQ1 and NQ2 have high threshold voltages Vthn as described above, the potential level of the storage node holding the H-level does not change even when the potential of the internal node, i.e., storage node at the L-level floats, and static noise margin SNM is originally large. Therefore, when voltage step-down quantity $\Delta V$ is small, the conductance of the access transistor slightly decreases to improve the static noise margin. When threshold voltage Vthn of the drive transistor of the memory cell shifts to a higher side, static noise margin SNM sufficiently increases, and excessive improvement is not necessary. In this case, voltage step-down quantity $\Delta V$ of voltage VDDR transmitted onto the selected word line is decreased.

When threshold voltages Vthn of drive transistors NQ1 and NQ2 in the memory cell are low, a problem does not arise even if the select voltage of the word line is set to a low voltage level, because the write margin is originally large in this state. When threshold voltages Vthn of drive transistors NQ1 and NQ2 of the memory cell shift toward a higher side, driver power supply voltage VDDR transmitted onto the selected word line shifts to a higher side, and thus shifts to improve the write margin.

In the data read operation, as described above, when word line WL is driven to the selected state, driver power supply voltage VDDR supplied by driver power supply circuit 10 is at a lower level than power supply voltage VDD. In response to the driving of word line WL to the selected, bit lines BL and /BL are coupled to storage nodes ND1 and ND2 of the selected memory cell, respectively, and the voltage levels thereof change depending on the storage data of the selected memory cell. In the memory cell, a column current supplied via the bit line raises the voltage level of storage node ND1 or ND2 that holds the L-level data. Even in this case, voltage level VDDR of selected word line WL is set according to threshold voltages Vthn of drive transistors (NQ1 and NQ2). Therefore, by adjusting the conductances of access transistors NQ3 and NQ4, static noise margin SNM of the memory cell can be ensured sufficiently so that the data can be read stably, and data destruction does not occur.

In the data write operation, driver power supply circuit 10 likewise sets word line WL to the level of voltage VDDR lower than power supply voltage VDD. In this case, the voltage level of selected word line WL is set in a manner linked to threshold voltages Vthn of drive transistors NQ1 and NQ2 in the memory cell, whereby the write margin can be sufficiently ensured, and the accurate data writing can be performed fast.

Driver power supply circuit 10 adjusts the voltage level of supply voltage (driver power supply voltage) VDDR according to the threshold voltage characteristics of the drive or access transistors in the memory cell. Thereby, the write and read margins of the memory cell are corrected according to the threshold voltages of the memory cell so that the data can be written and read fast and stably. The voltage adjusting operation of driver power supply voltage VDDR automatically performs correction on variations in write margin that may be caused by process variations in threshold voltage of drive transistors NQ1 and NQ2 in the memory cell.

Particularly, this driver power supply circuit 10 can use a passive resistance element to be described below as a voltage down-converter element. Thereby, variations in temperature characteristics of driver power supply circuit 10 can be small, and voltage step-down quantity ΔV can be set in a manner correctly linked to variations in threshold voltage of the drive and access transistors in the memory cell that depend on the temperature. The internal structure of driver power supply circuit 10 will now be described in detail.

First Embodiment

Figure 5:
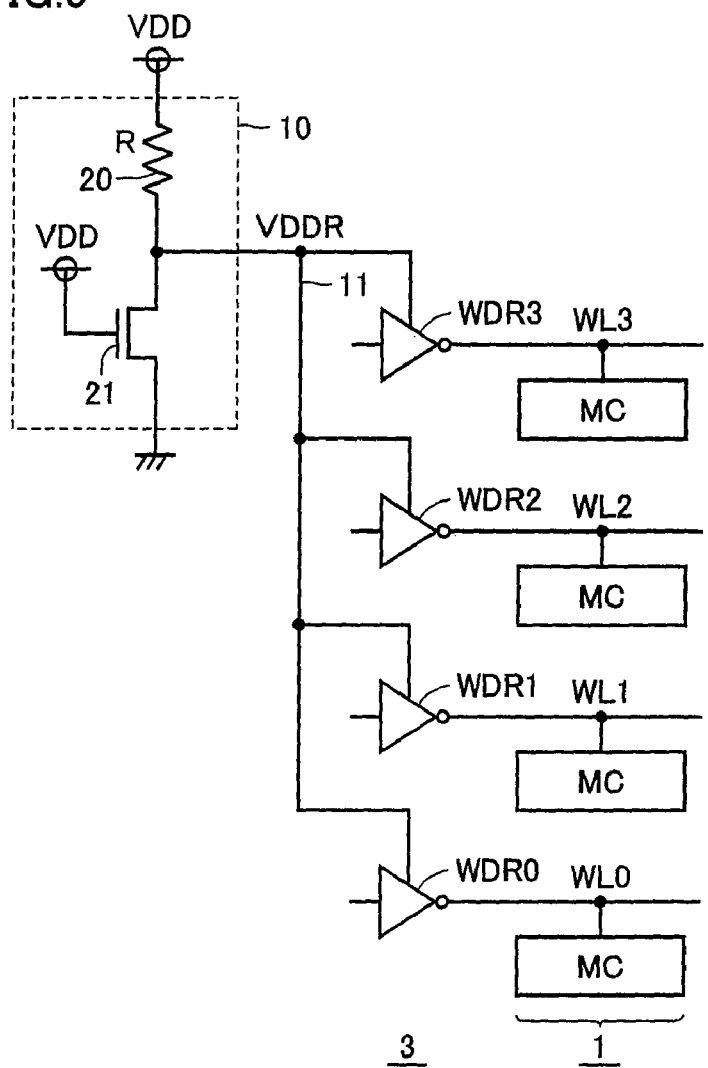
FIG. 5 shows a structure of a driver power supply circuit according to a first embodiment of the invention.

FIG. 5 schematically shows a major structure of the semiconductor memory device according to a first embodiment of the invention. In an example of memory cell array 1 shown in FIG. 5, memory cells MC are arranged in four rows and one column, and word lines WL0-WL3 are arranged corresponding to the respective rows. Word line drive circuit 3 includes word line drivers WDR0-WDR3 corresponding to word lines WL0-WL3, respectively. Driver power supply circuit 10 is provided with a series connection of a resistance element 20 and a pull-down element 21 shared among word line drivers WDR0-WDR3. For example, resistance element 20 employs an N+ polycrystalline silicon interconnection. Preferably, this resistance element is a non-silicide N+ polycrystalline silicon interconnection. Resistance element 20 that employs a passive element instead of a transistor can offer an advantage that a resistance value thereof does not change to a large extent even when a temperature changes. Pull-down element 21 is formed of an N-channel MOS transistor receiving power supply voltage VDD on its gate. This pull-down element 21 has the same threshold voltage characteristics as the N-channel MOS transistors (access and drive transistors) in memory cell MC, because the transistor forming the pull-down element is formed in the same manufacturing process as the memory cell.

Figure 6:
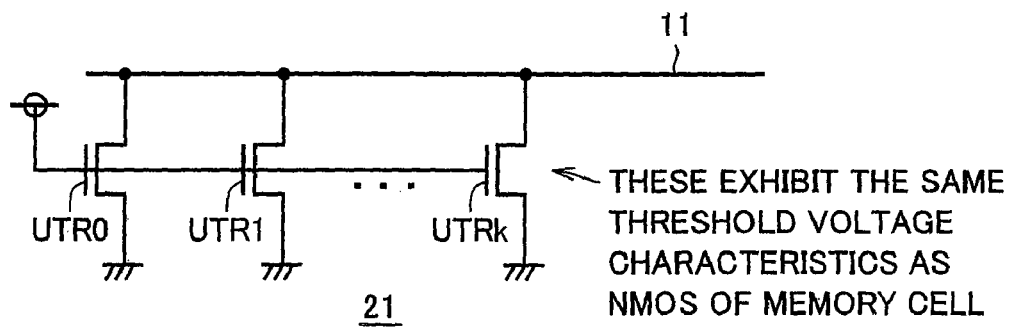
FIG. 6 schematically shows a structure of a pull-down transistor shown in FIG. 5.

As shown in FIG. 6, pull-down element 21 is formed of a plurality of unit transistors UTR0-UTRk connected together in parallel. Each of unit transistors UTR0-UTRk has the same size (the same ratio between a gate width and a gate length) as the access or drive transistor in memory cell MC. Since the plurality of transistors each having a relatively small current drive power similarly to the transistors in memory cell MC are arranged in parallel, pull-down transistor 21 can have a required current drive power.

Pull-down transistor 21 is an N-channel MOS transistor, and has a mobility that rises simultaneously with the rising of threshold voltage Vthn when the temperature is low. Therefore, the value of current for pulling down the voltage on a driver power supply line 11 do not change to a large extent. Conversely, at a high temperature, threshold voltage Vthn of this pull-down transistor lowers, and the mobility lowers with it so that the current does not change to a large extent. When resistance element 20 is formed of a non-silicide resistor of N+ doped polycrystalline silicon, sensitivity (a ratio of change in resistance value with respect to a temperature) is very small according to its temperature characteristics, although the resistance rises slightly at a high temperature. Therefore, owing to use of the series connection of resistance element 20 and pull-down transistor 21, driver power supply circuit 10 can have the sensitivity that changes only slightly with respect to the temperature, and is sufficiently large only with respect to the changes in threshold voltage Vthn of the access or drive transistor in memory cell MC.

Driver power supply voltage VDDR of driver power supply line 11 can be expressed by the following equation:

$$VDDR = VDD - I \times R$$

where I represents a current flowing through pull-down element 21.

Figure 7:
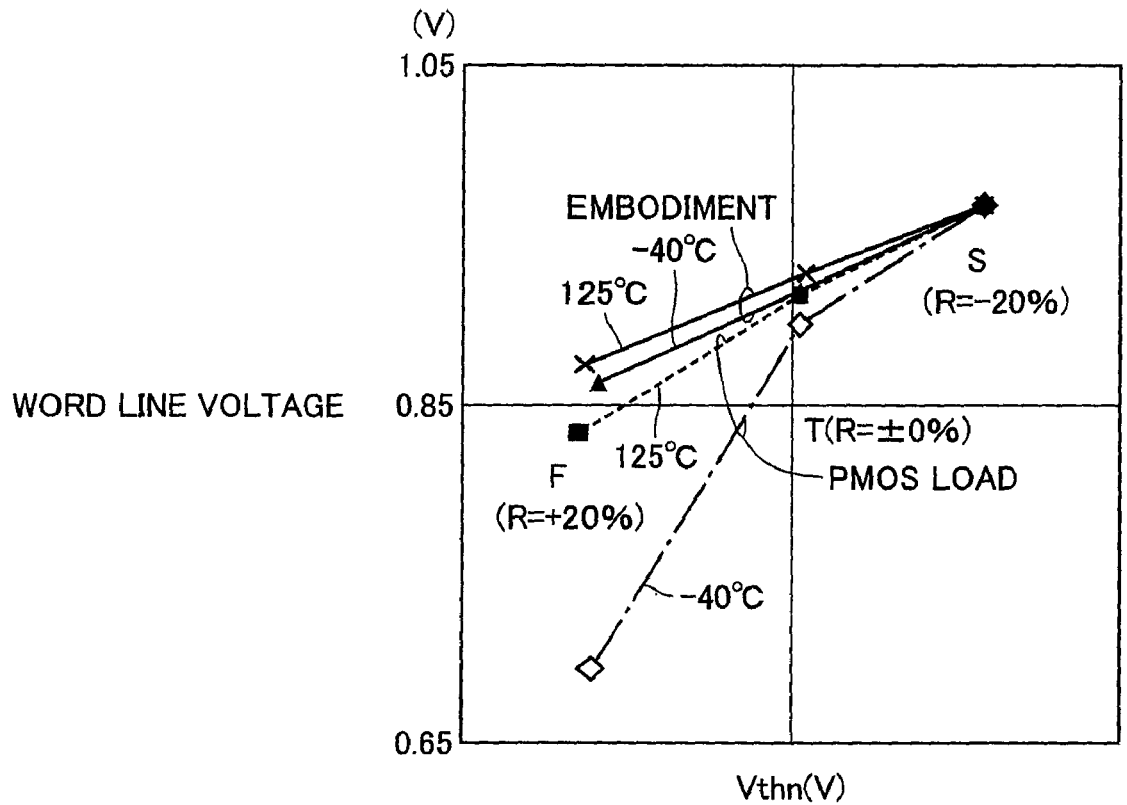
FIG. 7 illustrates a relationship between a driver power supply voltage and a threshold voltage of a memory cell transistor in the first embodiment of the invention.

FIG. 7 is a characteristic diagram illustrating a relationship between the word line voltage (driver power supply voltage VDDR) and threshold voltage Vthn of the memory cell transistor in the structure employing the driver power supply circuit shown in FIG. 5. In FIG. 7, the abscissa gives threshold voltage Vthn (volts) of the N-channel MOS transistor in the memory cell, and the ordinate gives the word line voltage (volts), i.e., driver power supply voltage VDDR. For comparison purposes, FIG. 7 also illustrates the characteristic curve exhibited when a PMOS transistor is used as the load transistor instead of resistance element 20.

In a state T, ideal values (design values) are attained in the pull-down MOS transistor. In a state S, the pull-down MOS transistor is in a slow state, i.e., the threshold voltage is large. In a state F, the pull-down transistor is in a fast state, i.e., the threshold voltage is low. The characteristic curves are represented at 125 degrees C. and −40 degrees C. As can be seen from the characteristic curves of solid lines in FIG. 7, a difference does not substantially occur between the characteristic curves at the respective temperatures of 125 degrees C. and −40 degrees C., and the characteristic curves indicating substantially the same temperature dependence can be achieved. As illustrated in FIG. 7, when the memory cell transistor (access transistor or drive transistor) has a high threshold voltage and is in state S, pull-down element 21 enters a slow state and the drive current quantity is small so that resistance element 20 steps down the voltage only to a small extent, and the word line voltage rises. Conversely, when the memory cell transistor enters fast state F of a low threshold voltage, the drive current quantity of pull-down transistor 21 increases according to state F, and resistance element 20 steps down the voltage to a large extent, and the word line voltage lowers.

In the case illustrated for the comparison purposes, the PMOS load is used, and driver power supply voltage VDDR is set by the resistance division between the pull-down element and the PMOS load. In this case, the following problem occurs. At a low temperature, the voltage level of driver power supply voltage VDDR lowers to a higher extent than that at a high temperature, and the write characteristics and read current at the low temperature lower. Therefore, the read margin may be improved, but the correct operations at a high speed may be impossible for the following reason.

The P- and N-channel MOS transistors have different temperature characteristics, respectively. More specifically, at a low temperature, the P-channel MOS transistor has a threshold voltage of a large absolute value and a drive current smaller than that at a high temperature. Therefore, when driver power supply voltage VDDR is set using P- and N-channel MOS transistors, the temperature characteristics of the P-channel MOS transistor affect to a larger extent, and driver power supply voltage VDDR lowers to a large extent at a low temperature, as can be seen from the characteristic curve of alternate long and short dash line in FIG. 7. The memory cell transistors (access and drive transistors) are N-channel MOS transistors. Therefore, it is preferable in characteristics of the memory cell to lower the word line voltage as far as possible in the read operation at a high temperature, and to suppress lowering of the word line voltage (driver power supply voltage VDDR) at a low temperature. When the above PMOS load is employed, however, the word line voltage (driver power supply voltage VDDR) significantly lowers at a low temperature as illustrated in FIG. 7, and the word line voltage control opposite to the ideal control is achieved.

Owing to use of the above passive resistance element (heavily doped N-type polycrystalline silicon (non-silicide) resistor), therefore, a difference hardly occurs in word line voltage characteristics due to the temperature, and the word line voltage (driver power supply voltage VDDR) can be set according to threshold voltage Vthn of the memory transistor so that the selected word line voltage can be set to the optimum voltage level within a wide temperature range.

More specifically, when the access and drive transistors in the memory cell have high threshold voltages, and the memory cell has a small static noise margin, the word line voltage is increased. Conversely, when the access and drive transistors in the memory cell have low threshold voltages, the word line voltage is decreased. Thereby, the static noise margin is improved, and the fast writing can be performed. The temperature does not cause a difference in word line voltage, and can suppress excessive lowering of the word line voltage at a low temperature.

In an example of the state illustrated in FIG. 7, a resistance value R of resistance element 20 lowers about 20% when threshold voltage Vthn of the MOS transistor increases (state S). When threshold voltage Vthn lowers, resistance value R of resistance element 20 increases about 20%. Since resistance element 20 is formed in the same step as the gate electrode of the memory cell transistor as described below (although the siliciding step is not performed on the resistance element), the resistance value reflects an influence of the change in a ratio between the gate width and length (channel length and width) of the MOS transistor so that the above changes in resistance value R occurs.

Figure 8A:
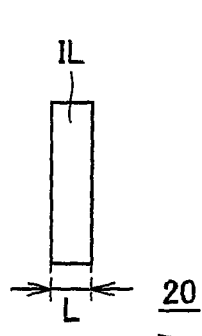
FIGS. 8A and 8B schematically show plane layouts of a resistance element and the memory cell transistor shown in FIG. 5.
Figure 8B:
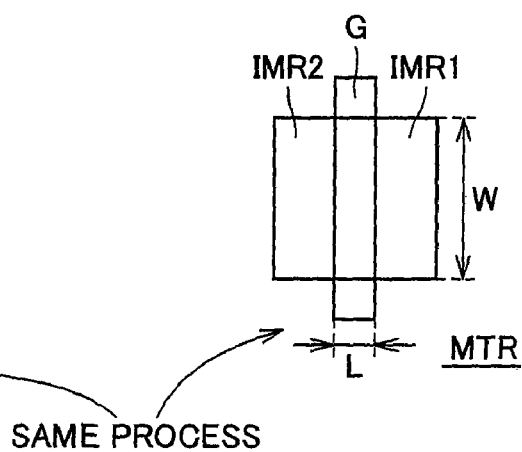

FIGS. 8A and 8B show, by way of example, structures of resistance element 20 and a memory cell transistor MTR, respectively. Memory cell transistor MTR is an N-channel MOS transistor, and is the access or drive transistor. Memory cell transistor MTR has impurity regions IMR1 and IMR2 as well as a gate electrode G arranged between impurity regions IMR1 and IMR2. A channel is formed under gate electrode G. The channel region has a channel width W and a channel length L. Channel length L corresponds to a width of gate electrode G.

Resistance element 20 is formed of an interconnection IL having a length equal to the channel length L of gate electrode G. Interconnection IL is a heavily doped N-type polycrystalline silicon interconnection, similarly to gate electrode G, but is a non-silicide resistor. Gate electrode G is silicided after preparing it made of polycrystalline silicon. This siliciding forms a depletion layer in the gate electrode of polycrystalline silicon, and the depletion layer prevents flow of a leak current, and increases the current drive power. The silicide gate electrode is a metal gate electrode, and has a small resistance value. For obtaining a sufficiently large resistance value, the siliciding is masked, and the heavily doped N-type polycrystalline silicon interconnection is used as the resistance element.

Further, resistance element 20 reflects variations in doping dose of impurity regions IMR1 and IMR2 of memory cell transistor MTR. More specifically, impurity regions IMR1 and IMR2 in memory cell transistor MTR undergo the impurity implantation using gate electrode G as a mask. Since interconnection IL of resistance element 20 and gate electrode G are formed in the same process, interconnection IL of resistance element 20 is subjected the impurity doping similarly to gate electrode G when impurity regions IMR1 and IMR2 are being formed. Therefore, the following effects can be expected.

As already described, the operation margin of the memory cell is sensitive to threshold voltage Vthn of the N-channel MOS transistor in the memory cell. When threshold voltage Vthn lowers, static noise margin SNM deteriorates. Conversely, when threshold voltage Vthn rises, static noise margin SNM is improved. It can be considered that variations in implantation dose of the impurity and variations in gate interconnection width (channel length) L cause the above variations in threshold voltage Vthn. In particular, according to the channel characteristics, the variations in channel length L significantly affect the variations in threshold voltage Vthn. As gate interconnection width (channel length) L decreases, threshold voltage Vthn lowers according to short channel roll-off characteristics. Conversely, when channel length L increases, threshold voltage Vthn rises. In view of the above, the following relationship can be achieved by providing resistance element 20 formed of the same polycrystalline silicon interconnection.

(i) Gate Length L of Memory Cell Transistor MTR Decreases:

In this case, threshold voltage Vthn of memory cell transistor MTR lowers, and the resistance value of polycrystalline silicon interconnection IL rises. Therefore, resistance value R of resistance element 20 increases so that driver power supply voltage VDDR lowers. (In this state, threshold voltage Vthn of pull-down transistor 21 has lowered, and the current drive quantity has increased.)

(ii) Gate Interconnection Width (Channel Length) L Increases:

In this case, threshold voltage Vthn of memory cell transistor MTR rises, and the resistance value of polycrystalline silicon interconnection IL lowers. Therefore, the drive current quantity of pull-down transistor 21 lowers. As a result of this lowering as well as the lowering of quantity of the current flowing through resistance element 20, the voltage step-down quantity of driver power supply voltage VDDR becomes small, and driver power supply voltage VDDR is set to a relatively high voltage level.

In addition to the adjustment of the current quantity by pull-down transistor 21, heavily doped N-type polycrystalline silicon interconnection IL of non-silicide is used as resistance element 20, and polycrystalline silicon interconnection IL has the interconnection width substantially equal to channel length L of memory cell transistor MTR. Thereby, the select voltage level of word line WL can be set to the optimum value while keeping higher sensitivity to variations in threshold voltage of memory cell transistor MTR.

According to the first embodiment of the invention, as described above, the voltage on the power supply node of the word line driver is set using the resistance element formed of the passive element other than the transistor as well as the pull-down transistor operating in a manner linked to the threshold characteristics of the memory cell transistor, and thereby the level of the voltage transmitted onto the selected word line is adjusted. Therefore, the temperature dependence of word line driver power supply voltage VDDR is reduced, and, driver power supply voltage VDDR can be set to the voltage level accurately linked to the variations in threshold voltage of the memory cell transistor. Thereby, the word line select voltage can be set to the optimum value within a wide temperature range in a manner linked to variations in threshold voltage of the memory cell transistor.

In particular, by employing the resistance element having the same width as the gate electrode of the memory cell transistor, it is possible to change the resistance value of the resistance element in a manner linked to variations in threshold voltage of the memory cell transistor, and the voltage on the selected word line can be adjusted more accurately.

Second Embodiment

Figure 9:
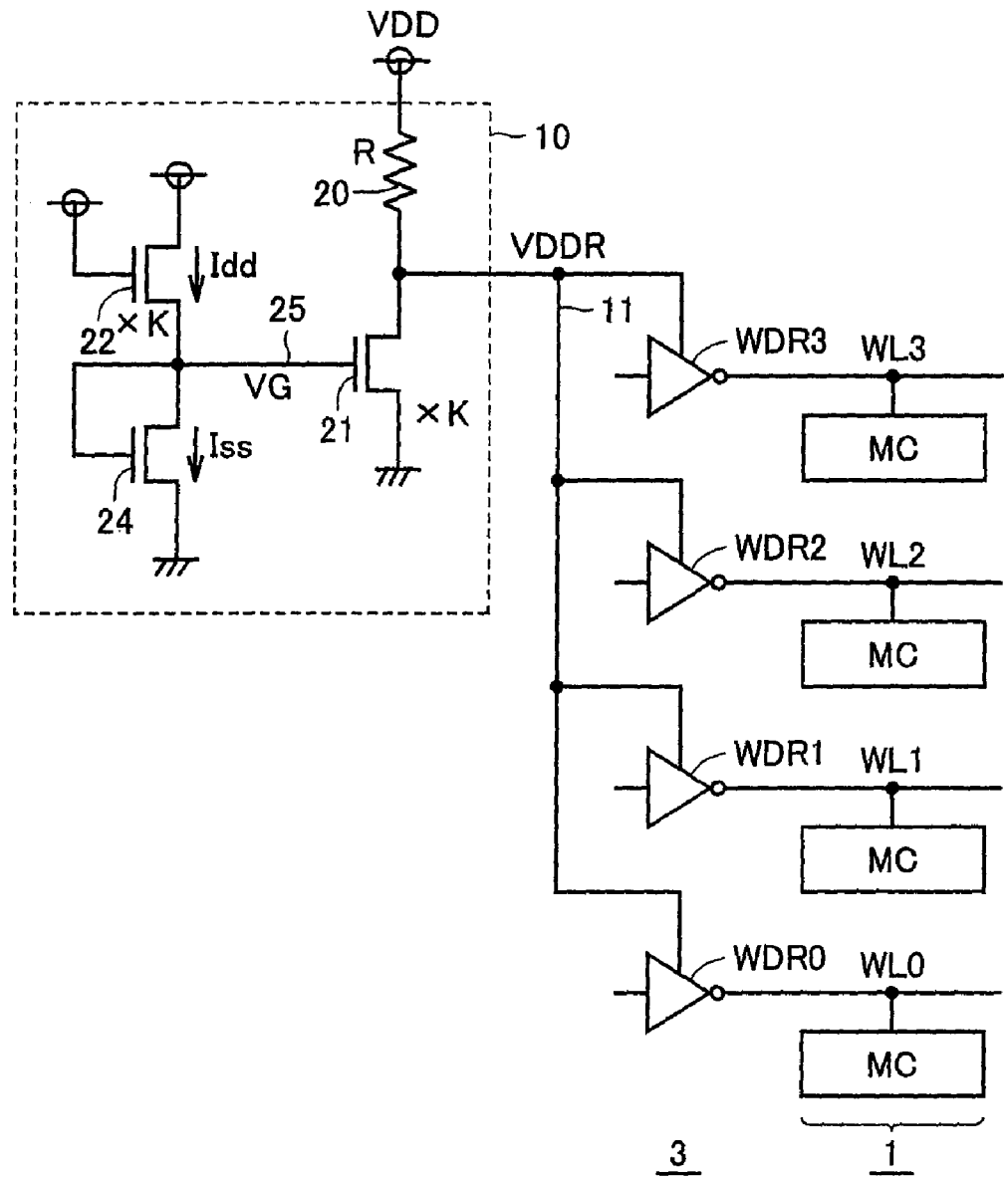
FIG. 9 shows a structure of a driver power supply circuit according to a second embodiment of the invention.

FIG. 9 shows a structure of driver power supply circuit 10 according to a second embodiment of the invention. In FIG. 9, driver power supply circuit 10 includes resistance element 20 connected between the power supply node and driver power supply line 11, and pull-down transistor 21 connected between driver power supply line 11 and a ground node. Resistance element 20 and pull-down transistor 21 have the same structures as those in the first embodiment. Therefore, pull-down transistor 21 is formed of the unit transistors (UTRs) of K in number connected in parallel.

Driver power supply circuit 10 further includes an N-channel MOS transistor 22 that is connected between the power supply node and an internal node 25, and has a gate connected to the power supply node, and an N-channel MOS transistor 24 that is connected between internal node 25 and the ground node, and has a gate connected to internal node 25. These transistors 21, 22 and 24 form a pull-down circuit that lowers the voltage level of voltage VDDR on the driver power supply line.

Similarly to pull-down transistor 21, N-channel MOS transistor 22 has substantially the same threshold voltage characteristics as the memory cell transistor, and is formed of unit transistors (UTRs) of K in number connected in parallel. N-channel MOS transistor 24 is formed of a logic transistor, and does not accurately reflect the variations in threshold voltage of the memory cell transistor. When this semiconductor memory device is integrated on the same semiconductor chip as a logic circuit such as another processor, logic transistor 24 has the same structure and sizes as a transistor which is a component of this logic circuit.

The logic transistor is different in gate length and impurity implantation dose from the memory cell transistors (access and drive transistors). However, when it is regarded as the N-channel MOS transistor, the threshold voltage has the same temperature characteristics as the memory cell transistor.

Internal node 25 is connected to a gate of pull-down transistor 21, of which gate voltage VG is adjusted by a ratio between on-resistances of transistors 22 and 24.

When threshold voltage Vthn of the N-channel MOS transistor of memory cell MC lowers, the threshold voltage of MOS transistor 22 likewise lowers to increase its supply current quantity. A current-voltage converting function of MOS transistor 24 raises the voltage level of gate voltage VG on node 25. Thereby, the conductance of pull-down transistor 21 lowers, and the voltage step-down quantity in resistance element 20 increases so that the voltage level of driver power supply voltage VDDR lowers. In this case, MOS transistor 24 does not reflect the variations in threshold voltage of the memory cell transistor. Accordingly, the variations in threshold voltage of the memory cell transistor is reflected in MOS transistor 22, but is not reflected in MOS transistor 24. Therefore, the variations in threshold voltage of the memory cell transistors are not cancelled in these transistors 22 and 24, and the conductance of pull-down transistor 21 can be adjusted by producing gate voltage VG of the pull-down transistor that accurately reflects the threshold voltage variations of the memory cell transistor.

When the N-channel MOS transistors (access and drive transistors) of memory cell MC have high threshold voltages Vthn, MOS transistor 22 likewise has a high threshold voltage so that the supply current quantity of MOS transistor 22 decreases. Thereby, the drive current of MOS transistor 24 lowers, and the voltage level of gate voltage VG on internal node 25 lowers. Thereby, the conductance of pull-down transistor 21 increases, and the quantity of current flowing through resistance element 20 lowers so that the voltage step-down quantity of resistance element 20 decreases, and the voltage level of driver power supply voltage VDDR rises.

Therefore, the voltage level of driver power supply voltage VDDR can be corrected depending on threshold voltage Vthn of the N-channel MOS transistor in memory cell MC without deteriorating the write characteristics and the read current while ensuring the static noise margin.

The following problem arises if MOS transistor 24 is formed of a transistor having the same threshold voltage characteristics as the memory cell transistor. The variations in threshold voltage of MOS transistor 22 and the variations in threshold voltage of MOS transistor 24 cause canceling of the variation components of the on-resistance ratio, and it is impossible to change the level of voltage VG on internal node 25 by reflecting the threshold voltage variations. By employing MOS transistor 24 formed of a logic transistor (i.e., a transistor forming a peripheral circuit or a transistor forming a processor or a logic circuit provided with the semiconductor memory device) different from the memory cell transistor, it is possible to adjust gate voltage VG of pull-down transistor 21 by reflecting the threshold voltage variations of the memory cell transistor at MOS transistor 22 connected in source follower manner.

At a low temperature, the supply current quantity of MOS transistor 22 does not change to a large extent. When the threshold voltage of MOS transistor 24 formed of the logic transistor lowers, the current-voltage converting function lowers the voltage level of gate voltage VG on internal node 25. MOS transistor 24 operates in a saturation region, and the drive current quantity is proportional to a square of a difference between gate voltage VG and the threshold voltage of MOS transistor 24. At a low temperature, therefore, the conductance of MOS transistor 21 becomes small, and the quantity of current flowing through resistance element 20 lowers (i.e., the on-resistance of MOS transistor 21 increases) so that driver power supply voltage VDDR shifts to a higher side. At a low temperature, therefore, voltage VDDR of word line WL shifts to a higher side as a whole within a variation range of the N-channel MOS transistors (access and drive transistors) in memory cell MC. Thereby, the word line voltage is set to correct the write characteristics and the read current to prevent deteriorations thereof to a further extent, and the operation temperature range is enlarged.

Figure 10:
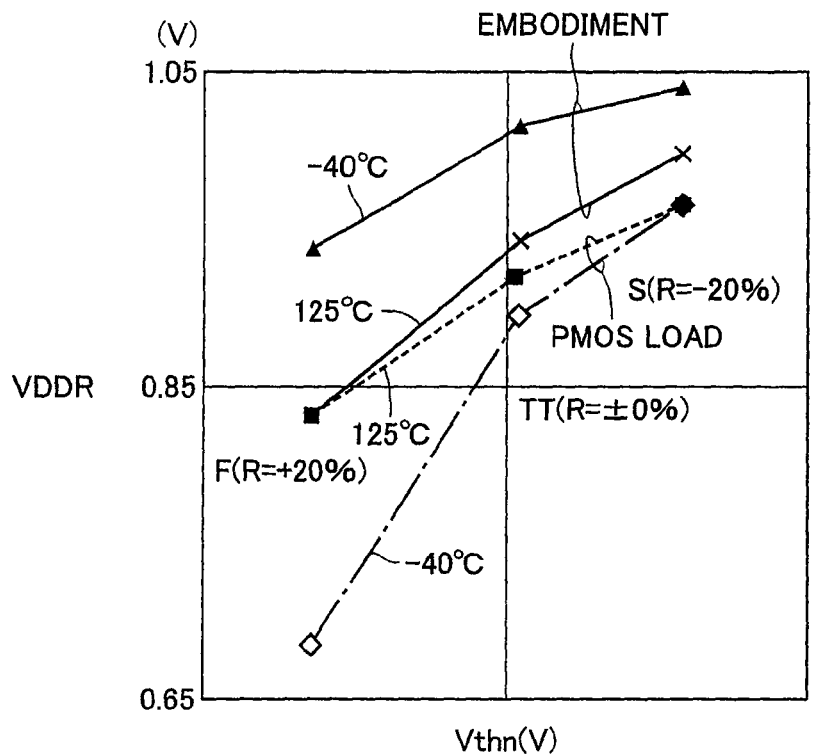
FIG. 10 illustrates a relationship between a threshold voltage of a transistor in a memory cell of the driver power supply circuit shown in FIG. 9 and a driver power supply voltage.

FIG. 10 illustrates a relationship between the threshold voltage and the produced voltage of driver power supply circuit 10 shown in FIG. 9. For comparison purposes, FIG. 10 also illustrates characteristics exhibited when resistance element 20 is replaced with a P-channel MOS transistor.

In FIG. 10, the abscissa gives threshold voltage Vthn (volts) of the memory cell transistor, and the ordinate gives driver power supply voltage VDDR (volts), i.e., the word line voltage.

In FIG. 10, when the temperature is low (−40 degrees C.), driver power supply voltage VDDR is set to a level higher than that at a high temperature (125 degrees C.). At either of the low and high temperatures, driver power supply voltage VDDR shifts to a lower side as threshold voltage Vthn decreases. Therefore, the voltage on the selected word line is adjusted to decrease with the lowering of the threshold voltage of the memory cell transistor. Conversely, when the P-channel MOS transistor is used as the load transistor, the voltage of selected word line in a low-temperature operation is lower than that in a high-temperature operation so that the voltage on the selected word line may excessively lower at a low temperature, and a stable operation may not be ensured. In the second embodiment, however, N-channel MOS transistor 22 is used for setting the gate voltage of the pull-down transistor at a low temperature as already described the voltage of, selected word line at a low temperature can be set higher than that at a high temperature, and ideal correction of the voltage of selected word line can be performed.

In FIG. 9, both the drain and gate of MOS transistor 22 are coupled to the same power supply node. However, MOS transistor 22 is merely required to operate in a source follower mode, and the gate potential thereof may be set to a fixed voltage level lower than the potential of the drain node.

Figure 11:
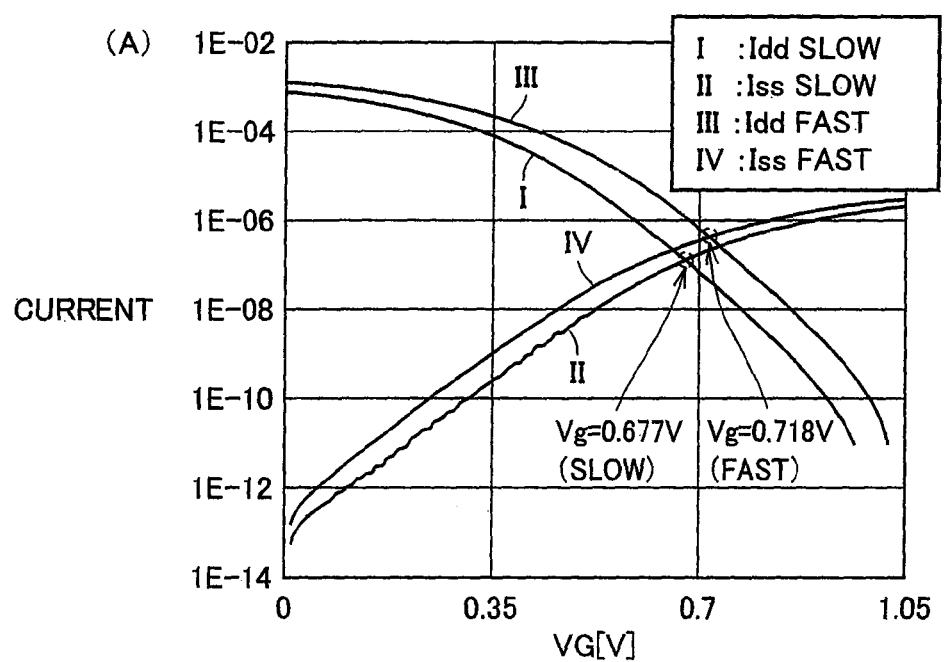
FIG. 11 illustrates a relationship between a gate voltage of each pull-down transistor shown in FIG. 9 and a drive current of the each transistor.

FIG. 11 illustrates a relationship between the supply current and voltage VG of MOS transistors 22 and 24 shown in FIG. 9. The abscissa gives gate voltage VG, and the ordinate gives supply currents Idd and Iss of transistors 22 and 24. Curves I and II represent supply currents Idd and Iss in a slow (low speed: S) state of MOS transistors 22 and 24, respectively. Curves III and IV represent supply currents Idd and Iss in a fast (high speed: F) state of MOS transistors 22 and 24, respectively. A crossing point of curves I and II of currents Idd and Iss in the slow state indicates an operation current at an operation point, and a crossing point of curves III and IV in the fast state indicates the operation current at the operation point. For example, gate voltage VG is 0.677 V in the slow state, and is 0.718 V in the fast state.

As illustrated in FIG. 11, when the N-channel MOS transistors change to the fast state (in which the threshold voltage is small), the current drive power of MOS transistor 22 increases, and the operation point (crossing point between curves DI and IV) Vg of gate voltage VG shifts to a higher side. When N-channel MOS transistors 22 and 24 change to the slow state, the current drive power of N-channel MOS transistor 22 decreases, and operation point Vg of gate voltage VG shifts to a lower side. Therefore, in the fast state where the memory cell transistor has a low threshold voltage, gate voltage VG is increased, and driver power supply voltage VDDR is lowered. When threshold voltage Vthn of the memory cell transistor shifts to a slow side, i.e., when threshold voltage Vthn shifts to a higher side, the current drive power of MOS transistor 22 decreases so that gate voltage VG lowers, and driver power supply voltage VDDR rises.

In the low-temperature operation, the current drive powers of N-channel MOS transistors 22 and 24 are slightly larger than those in the high-temperature operation although the temperature dependence thereof is small. MOS transistor 24 operates in a resistance mode, and the resistance value thereof becomes low at a low temperature so that the voltage level of gate voltage VG on internal node 25 lowers. Thereby, driver power supply voltage VDDR in the low-temperature operation is at the level shifted to a higher side than that in the high-temperature operation.

According to the second embodiment of the invention, as described above, the gate voltage of pull-down transistor 21 that sets driver power supply voltage VDDR is further adjusted according to variations in threshold voltage of the memory cell transistor, and the voltage of selected word line can be accurately adjusted according to the threshold voltage of the memory cell transistor.

Further, the driver power supply voltage in the low-temperature operation can be set to the voltage level higher than that in the high-temperature operation, and the stable operation can be performed even at the low temperature so that it is possible to achieve the semiconductor memory device that operates stably over a wide operation temperature range.

Third Embodiment

Figure 12:
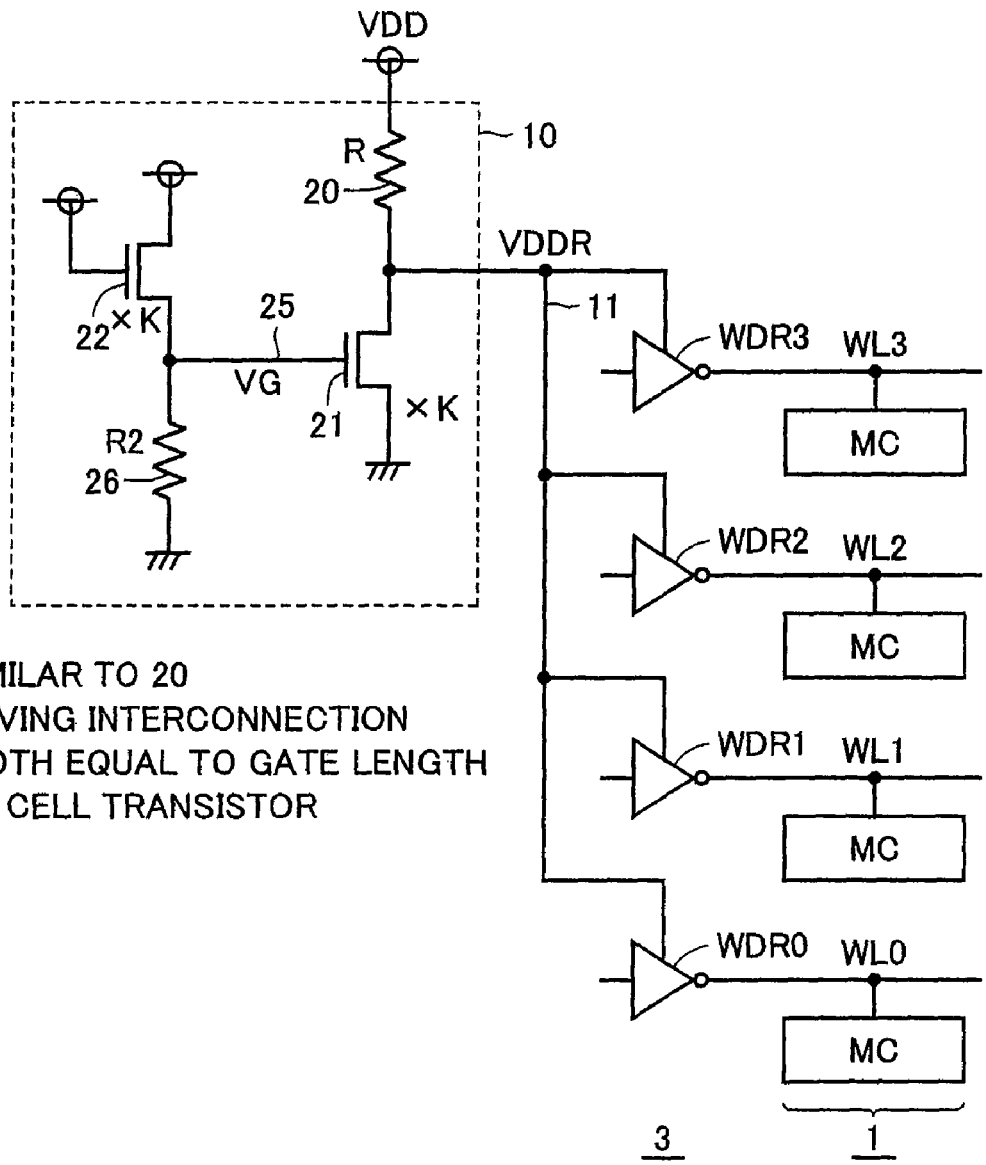
FIG. 12 shows a structure of a driver power supply circuit according to a third embodiment of the invention.

FIG. 12 schematically shows a structure of driver power supply circuit 10 according to a third embodiment of the invention. FIG. 12 likewise shows word line drivers WDR0-WDR3 in word line drive circuit 3, also shows memory cells MC arranged in four rows and one column in memory cell array 1 and word lines WL0-WL3 corresponding to the respective rows.

Driver power supply circuit 10 in FIG. 12 differs from driver power supply circuit 10 shown in FIG. 9 in the following structure. A resistance element 26 is used in stead of N-channel MOS transistor 24 formed of the logic transistor. Similarly to resistance element 20, resistance element 26 has an interconnection width equal to the gate length (channel length) of the N-channel MOS transistor in memory cell MC (see FIG. 8). Other structures of driver power supply circuit 10 shown in FIG. 12 are the same as those of the driver power supply circuit shown in FIG. 9. The corresponding portions bear the same reference numbers, and description thereof is not repeated.

In the structure shown in FIG. 12, MOS transistors 21 and 22 as well as resistance element 26 form a pull-down circuit. MOS transistor 22 is merely required to operate in the source follow mode, and may have a gate and a drain connected to different voltage levels, respectively, similarly to the second embodiment (such that a gate potential is at a level lower than a drain voltage).

In driver power supply circuit 10 shown in FIG. 12, resistance element 20 and pull-down transistor 21 adjust driver power supply voltage VDDR in the same manner as the second embodiment. MOS transistor 22 is substantially the same as that in the second embodiment, and thus is formed of the unit transistors of K in number connected in parallel. Resistance element 26 is formed of N-type heavily doped (N+) polycrystalline silicon non-silicide interconnection. Therefore, in the circuit formed of MOS transistor 22 and resistance element 26, the temperature dependence of the supply current can be substantially eliminated, and thereby the temperature dependence of gate voltage VG on internal node 25 can be substantially eliminated.

More specifically, it is assumed that gate length (channel length) L of the memory cell transistor is small. In this case, threshold voltage Vthn of the N-channel MOS transistor in memory cell MC lowers. Thereby, the threshold voltage of MOS transistor 22 lowers to increase its supply current quantity. In this state, the interconnection width of resistance element 26 increases so that a resistance value R2 thereof increases. Therefore, the voltage level of gate voltage VG on internal node 25 rises. Thereby, the conductance of pull-down transistor 21 increases, and driver power supply voltage VDDR lowers. Therefore, when threshold voltage Vthn of the access or drive transistor in memory cell MC lowers, the voltage transmitted onto the selected word line can be lowered corresponding to it.

It is now assumed that gate length (channel length) L of the transistor in memory cell MC increases. In this case, the threshold voltage of the access or drive transistor in memory cell MC increases. Thereby, the threshold voltage of MOS transistor 22 increases, and the drive current quantity lowers. In resistance element 26, the interconnection width increases, and the resistance value lowers. Therefore, the voltage level of gate voltage VG on internal node 25 lowers, and the conductance of pull-down transistor 21 lowers. Thereby, the voltage level of driver power supply voltage VDDR rises. Accordingly, the voltage level of the selected word line can be increased when the threshold voltage increases according to increase in channel length of the access or drive transistor in memory cell MC.

Therefore, the gate potential of pull-down transistor 21 can be adjusted according to the variations in threshold voltage of the access or drive transistor in memory cell MC, and driver power supply voltage VDDR can be adjusted to prevent deterioration of the write characteristics and the read current.

According to the third embodiment of the invention, as described above, the gate voltage of the pull-down transistor is produced by the transistor having substantially the same threshold voltage characteristics as the memory cell transistor as well as the N-type heavily doped polycrystalline silicon non-silicide resistor having the resistance value of a small temperature dependence. Therefore, by reducing the temperature dependence of the gate voltage of the pull-down transistor, the gate voltage of the pull-down transistor can be corrected depending on the threshold voltage variations of the transistor in the memory cell.

Fourth Embodiment

Figure 13:
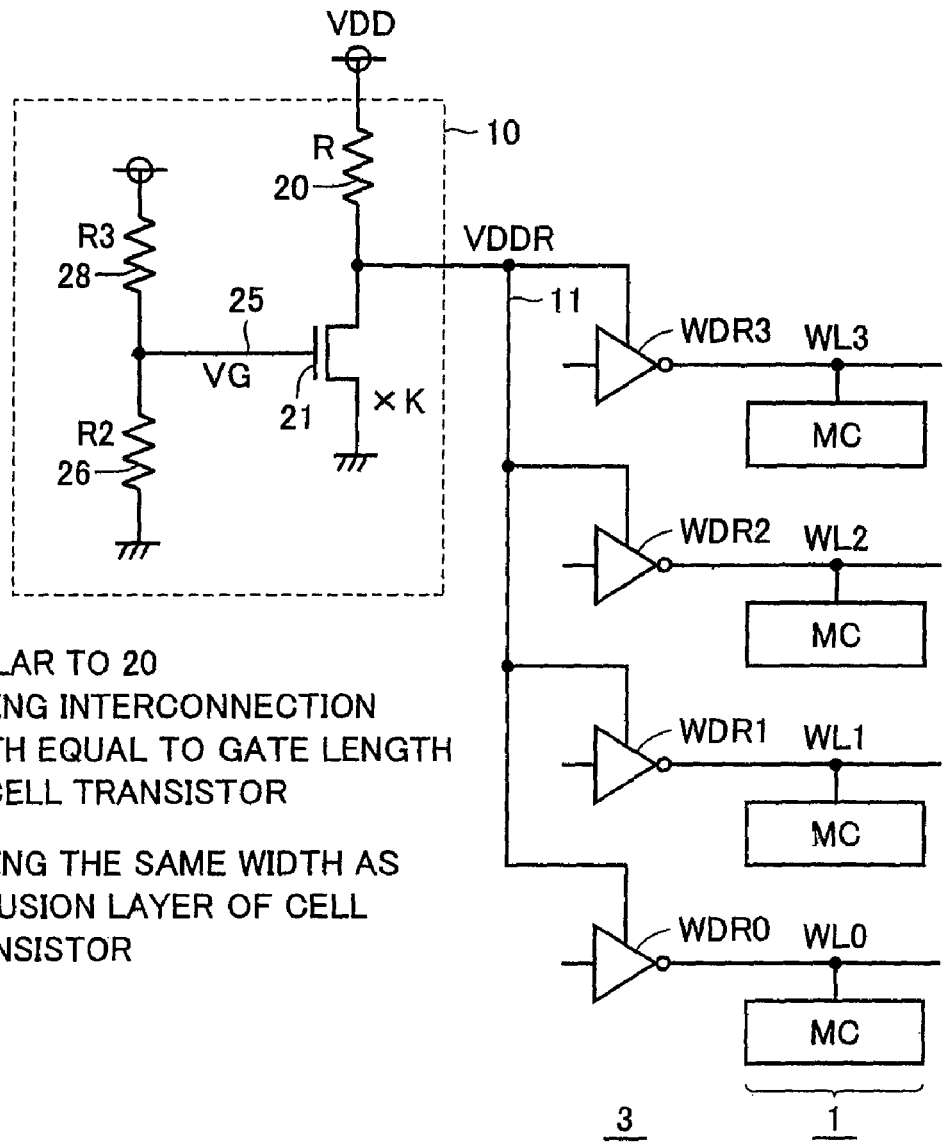
FIG. 13 shows a structure of a driver power supply circuit according to a fourth embodiment of the invention.

FIG. 13 shows a major structure of a semiconductor memory device according to a fourth embodiment of the invention. In the semiconductor memory device shown in FIG. 13, the structure of driver power supply circuit 10 is different from that shown in FIG. 12. More specifically, driver power supply circuit 10 includes a passive resistance element 28 instead of MOS transistor 22 shown in FIG. 22. Passive resistance element 28 is formed of an N-type heavily doped non-silicide diffusion resistor having a width equal to channel width W of the N-channel MOS transistor in memory cell MC. Other structures of the semiconductor memory device shown in FIG. 13 are the same as those of the semiconductor memory device shown in FIG. 12. The corresponding portions bear the same reference numbers, and description thereof is not repeated.

Figure 14A:
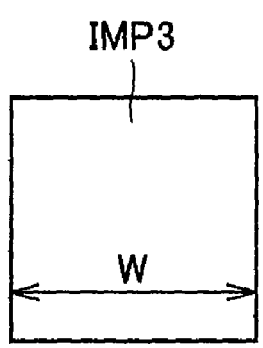
FIGS. 14A-14C illustrate relationships in size between two resistance elements and a memory cell transistor shown in FIG. 13.
Figure 14B:
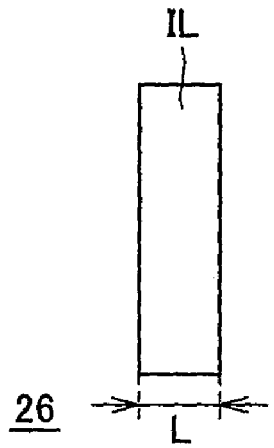
Figure 14C:
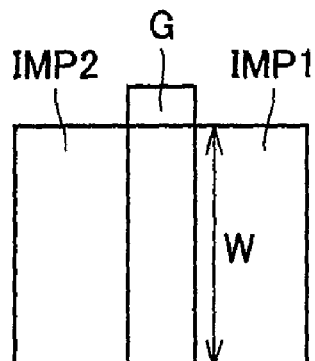

FIGS. 14A-14C schematically show layouts of resistance element 28, resistance 26 and the N-channel MOS transistor included in memory cell MC, respectively. In FIGS. 14A-14C, memory cell transistor MTR (access or drive transistor) has impurity regions IMP1 and IMP2 as well as gate electrode G arranged between these impurity regions IMP1 and IMP2. It has a gate electrode width (channel width) of W and a gate length (channel length) of L. Resistance element 28 is formed in the same impurity implanting step as impurity regions IMP1 and IMP2, is a diffusion resistor formed of this impurity region, and has a line width W equal to the channel width (gate width) of memory cell transistor MTR. Each of impurity regions IMP1 and IMP2 of memory cell transistor MTR has a surface that is silicided to form an ohmic contact to an electrode interconnection. The silicided surface prevents junction destruction that may be cause by penetration of an electrode interconnection, and reduces a resistance of the impurity region. The impurity implantation of diffusion resistance element 28 is performed in the same step as the memory cell transistor, but the siliciding of the surface is not performed for keeping a high resistance value.

Similarly to the structure of the first embodiment shown in FIGS. 8A and 8B, resistance element 26 is a heavily doped N-type polycrystalline silicon non-silicide resistance element having the same line width as a width (channel length) L of gate electrode G.

In the structure shown in FIGS. 14A-14C, line width L of interconnection IL of resistance element 26 reflects the variations that occur in threshold voltage of memory cell transistor MTR due to variations in gate length L of memory cell transistor MTR. Resistance element 28 is formed of an impurity region IMP3, and reflects variations in channel width of memory cell transistor MTR. Therefore, when memory cell transistor MTR has a large channel width (gate width) W, the current passing through memory cell transistor MTR increases to achieve equivalently a state that the threshold voltage becomes low. In this case, resistance element 28 has a large width and a low resistance value R3 so that voltage VG on internal node 25 rises, and driver power supply voltage VDDR is adjusted to lower.

When channel width W of memory cell transistor MTR decreases, the drive current quantity of memory cell transistor MTR decreases, and the threshold voltage equivalently increases. In this case, width W of impurity region IMP3 of resistance element 28 decreases so that the resistance value thereof rises. Therefore, the step-down quantity of the voltage on internal node 25 increases, and voltage VG lowers. Thereby, the conductance of pull-down transistor 21 decreases, and driver power supply voltage VDDR is set to a high voltage level.

When channel length L varies, resistance element 26 performs feedback on voltage VG to reflect the variations for correction. In this manner, driver power supply voltage VDDR is adjusted.

Therefore, when the N-channel MOS transistor (access or drive transistor) in memory cell transistor MC has small gate width (channel width) W and thereby has the small current drive quantity, driver power supply voltage VDDR increases so that the level of the voltage (driver power supply voltage VDDR) of the selected word line is adjusted to increase the read current in the memory cell transistor. The change in voltage of the selected word line is caused in the same direction as that for increasing the current passing the access transistor for writing, and the write characteristics are likewise improved. Thereby, driver power supply voltage VDDR can be corrected in the direction that does not lower the write characteristics and the read current.

When the memory cell transistor has large channel width W and therefore a large current drive quantity, driver power supply voltage VDDR is set to a low voltage level. Thereby, the current drive quantity of the access transistor decreases, and the read margin is improved. In the write operation, when the current drive quantity of the memory cell transistor is large, the write margin is sufficiently ensured. In this state, therefore, even when the current drive quantity of the access transistor decreases, the data writing can be performed sufficiently stably and fast.

The diffusion resistor and the polycrystalline silicon non-silicide resistor may be replaced with silicided resistors provided that these have resistance values required for the voltage adjustment.

According to the fourth embodiment of the invention, as described above, the diffusion resistor having the width equal to the channel width of the memory cell transistor is used, and the voltage divider circuit is formed of the series connection of this diffusion resistor element and the heavily doped N-type polycrystalline silicon non-silicide interconnection having the interconnection width equal to the gate length of the transistor. Therefore, variations in either of the gate width and gate length of the memory cell transistor can be fed back on the voltage level of driver power supply voltage VDDR so that the voltage level of driver power supply voltage VDDR can be corrected. Thereby, the selected word line voltage can be set according to the state of the memory cell transistor. Also, the diffusion resistor and the polycrystalline silicon non-silicide resistor (or silicided resistor) are used, and the temperature dependence thereof are small so that the temperature dependence of the gate voltage of the pull-down transistor can be sufficiently small. Therefore, the selected word line voltage can be accurately corrected over a wide temperature range.

Fifth Embodiment

Figure 15:
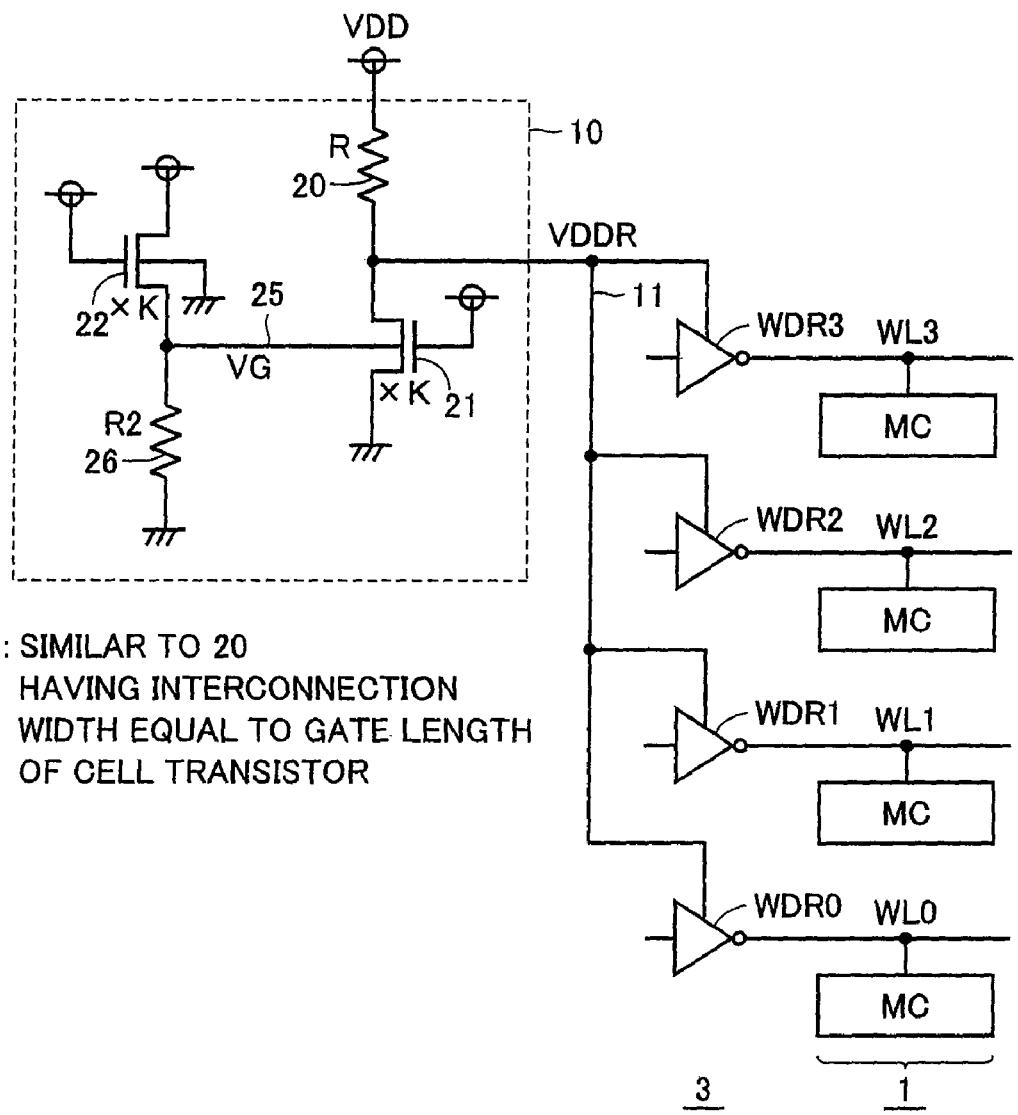
FIG. 15 shows a structure of a driver power supply circuit according to a fifth embodiment of the invention.

FIG. 15 shows a structure of a cell power supply circuit according to a fifth embodiment of the invention. Word line drive circuit 3 and memory cell array 1 have the same structures as those already discussed in the first to fourth embodiments. The corresponding portions bear the same reference numbers, and description thereof is not repeated.

The structure of the cell power supply circuit shown in FIG. 15 differs from that of driver power supply circuit 10 shown in FIG. 12. More specifically, the substrate potential (back gate potential) of pull-down transistor 21 is adjusted instead of its gate potential. A substrate region (back gate) of pull-down transistor 21 receives voltage VG on node 25. A gate of pull-down transistor 21 is coupled to the power supply node, and receives a constant voltage.

When voltage VG rises, a back gate effect relatively lowers the source potential of MOS transistor 21 (voltage VG is positive), and the current drive quantity of pull-down transistor 21 increases. Thereby, the voltage step-down quantity of resistance element 20 increases, and driver power supply voltage VDDR lowers.

When voltage VG lowers, the back gate potential of MOS transistor 21 lowers within a positive range, and the back gate effect raises the threshold voltage of MOS transistor 21 and decreases the drive current quantity. Thereby, the degree of voltage step-down of resistance element 20 decreases, and driver power supply voltage VDDR is corrected to a high voltage level.

The state in which voltage VG is high corresponds to the state in which threshold voltage of the access or drive transistor in memory cell MC is low. Therefore, according to the variations in threshold voltage of the memory cell transistor, driver power supply voltage VDDR, i.e., the voltage of the selected word line can be set accurately to the voltage level not impairing the write characteristics and the read current.

In the structure shown in FIG. 15, when a PN junction between the back gate of pull-down MOS transistor 21 and the source/drain thereof is forwardly biased, a conducting state is achieved between the back gate (P-well) and the source/drain impurity region of MOS transistor 21. Therefore, it is necessary to set voltage VG to the voltage level equal to or lower than a built-in voltage Vdp of the PN junction between the impurity region (source/drain) and the substrate region.

[First Modification]

Figure 16:
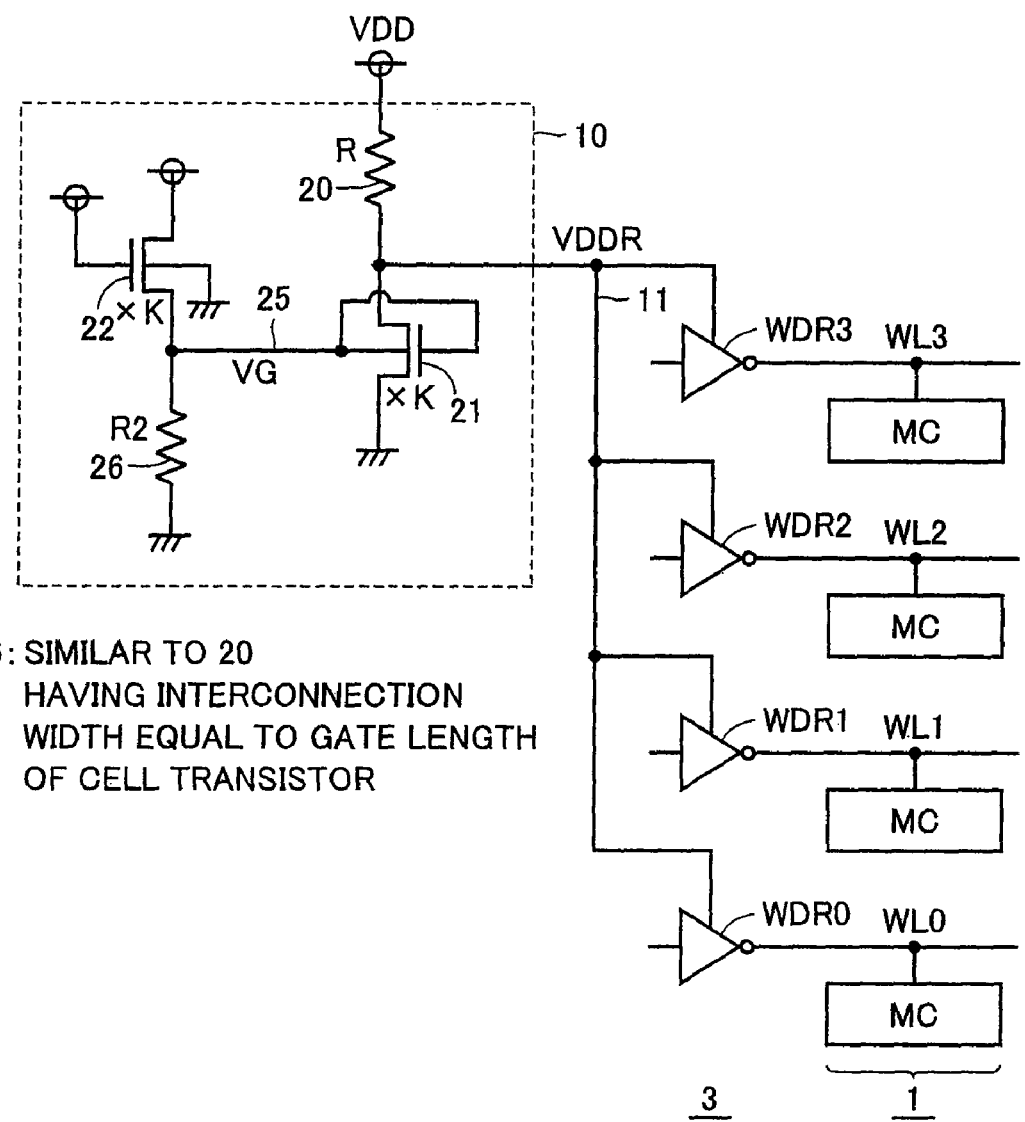
FIG. 16 shows a structure of a driver power supply circuit of a first modification of the fifth embodiment of the invention.

FIG. 16 shows a structure of a modification of the fifth embodiment of the invention. In driver power supply circuit 10 shown in FIG. 16, both the back gate and the control gate of MOS transistor 21 for pull-down are connected to internal node 25. Other structures of the drive power supply circuit 10 are the same as those of driver power supply circuit 10 shown in FIG. 15. The corresponding portions bear the same reference numbers, and description thereof is not repeated.

Also, word line drive circuit 3 and memory cell array 1 have the same structures as those in FIG. 15. The corresponding portions bear the same reference numbers, and description thereof is not repeated.

In the structure of driver power supply circuit 10 shown in FIG. 16, when voltage VG on internal node 25 rises (to a positive level not exceeding built-in voltage Vdp), the back gate effect lowers the threshold voltage of MOS transistor 21, and the voltage on its gate rises. Further, the threshold voltage lowers, and the current drive power increases (the conductance increases). In this case, therefore, driver power supply voltage VDDR lowers (the voltage step-down quantity of resistance element 20 increases). Conversely, when voltage VG lowers within a positive range, the threshold voltage of pull-down transistor 21 rises, and the control gate voltage lowers so that the threshold voltage further rises. In this case, therefore, the pull-down function of pull-down transistor 21 lowers, and driver power supply voltage VDDR rises.

Therefore, by adjusting the potentials of both the back gate and control gate, it is likewise possible to adjust the voltage level of driver power supply voltage VDDR according to the variations in threshold voltage of the memory cell transistor.

When the back gate and the control gate are connected, the source potential of pull-down transistor 21 apparently lowers by voltage VG. Therefore, pull-down transistor 21 can adjust the drive current quantity according to voltage VG when voltage VG is in a range between half the threshold voltage (Vthn/2) and voltage Vdp (built-in voltage of the PN junction).

[Second Modification]

Figure 17:
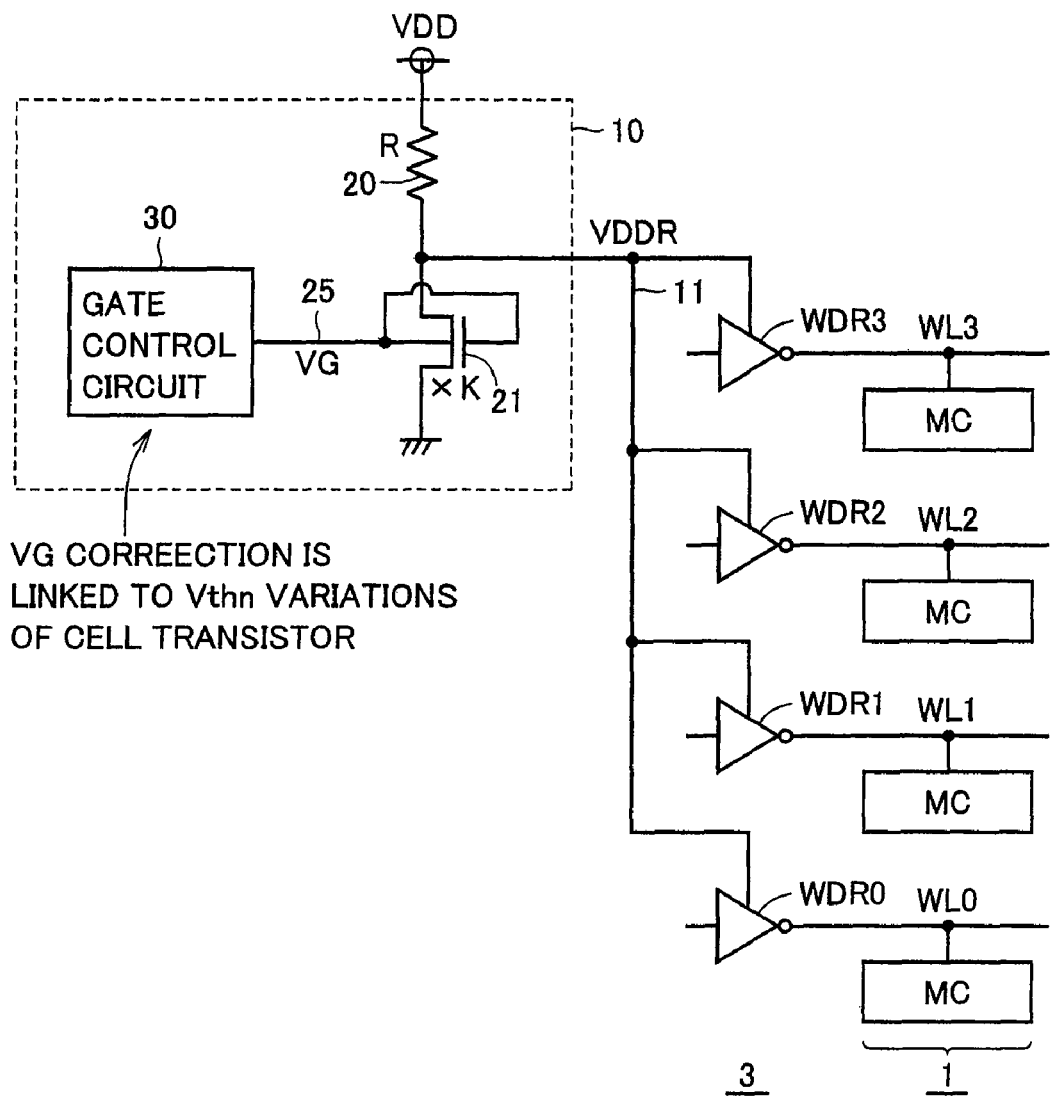
FIG. 17 shows a structure of a driver power supply circuit of a second modification of the fifth embodiment of the invention.

FIG. 17 shows a structure of a second modification of driver power supply circuit 10 according to the fifth embodiment of the invention. In FIG. 17, the structures of memory cell array 1 and word line drive circuit 3 are the same as those shown in FIGS. 15 and 16. The corresponding portions bear the same reference numbers, and description thereof is not repeated.

Driver power supply circuit 10 shown in FIG. 17 includes a gate control circuit 30 for adjusting the potentials of the back gate and control gate of pull-down transistor 21. Gate control circuit 30 may have any one of the structures in the second to fifth embodiments. The voltage level of voltage VG is adjusted according to the variations in threshold voltage of the N-channel MOS transistor (access or drive transistor) of memory cell MC.

In the structure of driver power supply circuit 10 shown in FIG. 17, gate control circuit 30 may be configured to adjust merely the control gate potential of pull-down transistor 21, and to maintain the back gate of pull-down transistor 21 at a fixed potential.

According to the fifth embodiment of the invention, as described above, the back gate potential of the pull-down transistor is adjusted in a manner linked to variations in threshold voltage of the memory cell transistor, and the voltage level of driver power supply voltage VDDR can be adjusted in a manner accurately linked to the variations in threshold voltage of the memory cell transistor.

Sixth Embodiment

Figures 18, 19:
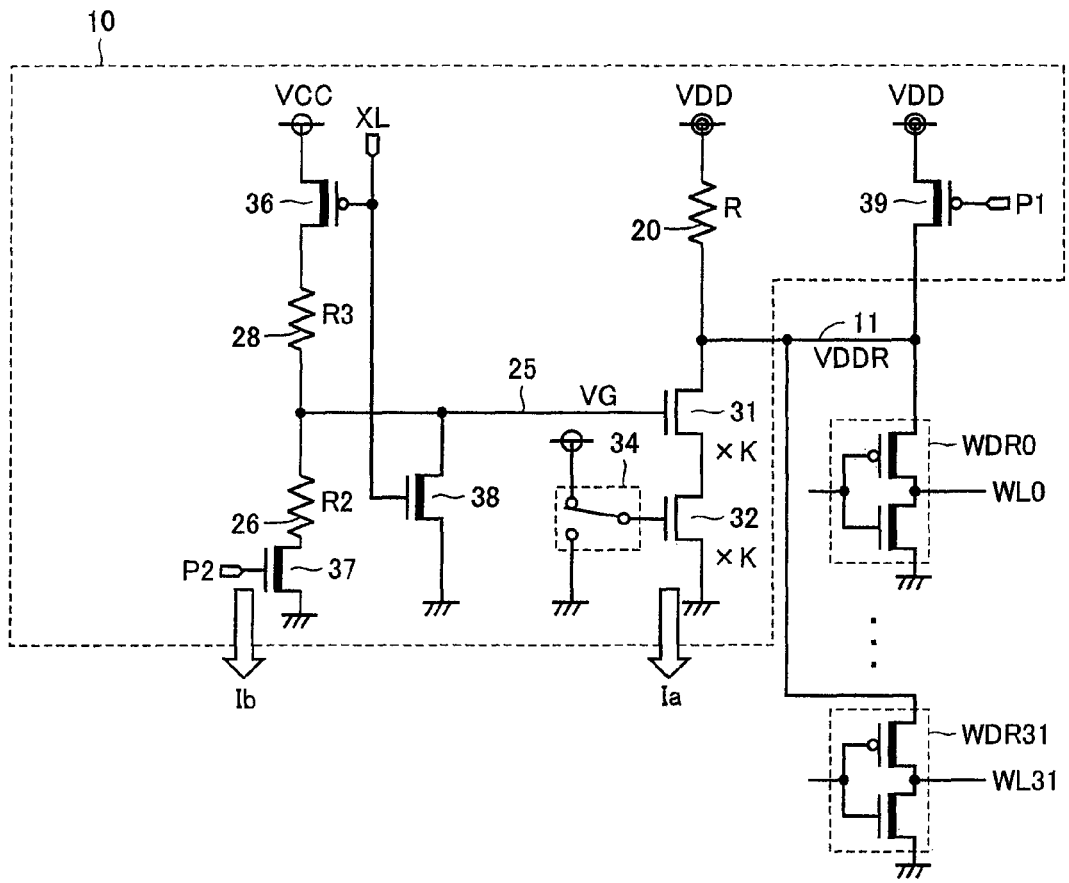
FIG. 18 shows a structure of a driver power supply circuit according to a sixth embodiment of the invention.
FIG. 19 is a list illustrating logic of a control signal and details of operations of the driver power supply circuit shown in FIG. 18.

FIG. 18 shows a structure of driver power supply circuit 10 according to a sixth embodiment of the invention. Driver power supply circuit 10 is shared among word lines WL0-WL31. More specifically, driver power supply line 11 extending from driver power supply circuit 10 is shared among word line drivers WDR0-WDR31 provided corresponding to respective word lines WL0-WL31.

Driver power supply circuit 10 includes, as pull-down elements, N-channel MOS transistors 31 and 32 connected in series between driver power supply line 11 and the ground node. Each of N-channel MOS transistors 31 and 32 is formed of unit transistors (UTRs) of K in number that are connected in parallel and each has the same threshold voltage characteristics as the memory cell transistor shown in FIG. 8.

A program switch circuit 34 is arranged for MOS transistor 32. Program switch circuit 34 selectively turns on a predetermined number of unit transistors among the K unit transistors to adjust a value of a drive current Ia of pull-down transistor 32.

Resistance element 20 formed of a passive element is arranged between driver power supply line 11 and the power supply node (VDD). Resistance element 20 is an N-type heavily doped polycrystalline silicon non-silicide resistor, similarly to the those in the first to fifth embodiments.

Driver power supply circuit 10 further includes a P-channel MOS transistor 36 that is connected between the power supply node (VCC) and resistance element 28, and has a gate receiving a high-order decode signal (row block select signal) XL, an N-channel MOS transistor 37 that is connected between the ground node and resistance element 26, and drives internal node 25 to the ground voltage level via resistance element 26 according to a control signal P2, an N-channel MOS transistor 38 that couples internal node 25 to the ground node according to high-order decode signal XL, and a P-channel MOS transistor 39 that couples driver power supply line 11 to the power supply node (VDD) according to a control signal P1.

Power supply voltage VDD is used for driving the word line, and a power supply voltage VCC is used for driving peripheral circuits. These power supply voltages VDD and VCC may be at the same voltage level or different voltage levels, respectively.

In FIG. 18, thick lines represent the channel regions of the transistors other than MOS transistors 31 and 32. This representation means that these transistors are array peripheral transistors having threshold voltages not linked to the threshold voltage of the transistor in the memory cell.

Driver power supply circuit 10 is arranged for the set of word lines WL0-WL31. High-order decode signal XL indicates the row block including the 32 word lines. High-order decode signal XL is at the L-level in the select operation. Therefore, when the set (row block) of the corresponding word lines is selected, voltage VG on internal node 25 is set according to the on/off state of MOS transistor 37. When control signal P2 is at the H-level and the MOS transistor 37 is on, the voltage level of internal node 25 is set to the level determined by the division ratio that is determined by resistance values R3 and R2 of resistance elements 28 and 26. When control signal P2 is at the L-level and MOS transistor 37 is off, internal node 25 is at the level of power supply voltage VCC. Therefore, control signal P2 can set the on resistance of pull-down MOS transistor 31, and therefore can adjust the voltage level of voltage VDDR of driver power supply line 11.

When the corresponding row block is in the unselected state, high-order decode signal XL is at the H-level so that MOS transistor 36 is off, and MOS transistor 38 is on. Therefore, internal node 25 is coupled to the ground node regardless of the on/off state of MOS transistor 37, and gate voltage VG attains the ground voltage level. In this state, the path of a through current in resistance elements 26 and 28 is interrupted. Thereby, current consumption in the unselected block and during standby can be reduced.

When the corresponding row block is selected, resistance element 20 and MOS transistors 31 and 32 pass, as current Ia, only a current of substantially the same order as the read current. When control signal P2 turns on MOS transistor 37 and the resistance-division by resistance elements 26 and 28 sets voltage VG on internal node 25, a current Ib flows through MOS transistor 37 and resistance elements 26 and 28. This current Ib is much smaller than current Ia by about two digits, and has a magnitude that can sufficiently satisfy low standby current conditions. Resistance elements 26 and 28 are configured to have sufficiently large resistance values R2 and R3, respectively. The on resistance of MOS transistor 37 is much smaller than the resistance values of resistance elements 26 and 28, and is substantially ignorable. Resistance values R2 and R3 of resistance elements 26 and 28 are set such that divided voltage VG attains the voltage level equal to or higher than threshold voltage Vthn of MOS transistor 31.

MOS transistors 31, 32, 36, 37, 38 and 39 as well as resistance elements 26 and 28 form the pull-down circuit.

FIG. 19 is a list illustrating the operation mode of driver power supply circuit 10 shown in FIG. 18, states of control signals P1 and P2, and operation details thereof.

Three modes MODE_A, MODE_B and MODE_C are prepared as the operation modes of driver power supply circuit 10.

(i) Mode MODE_A

In this mode, control signals P1 and P2 are at the L- and H-levels, respectively. High-order decode signal XL is fixed at the H-level. In this state, MOS transistor 39 is on, and MOS transistor 37 is on. MOS transistor 36 is off, and MOS transistor 38 is on. Therefore, MOS transistors 37 and 38 fix voltage VG on node 25 to the L-level (ground voltage level). MOS transistor 39 and resistance element 20 fix voltage VDDR on driver power supply line 11 at the level of power supply voltage VDD. In this mode MODE_A, selected word line WL is driven to the level of voltage VDD. Therefore, this mode is set when the memory cell has a sufficient static noise margin and the write characteristics are sufficiently ensured.

(ii) Mode MODE_B

In this mode, control signals P1 and P2 are set to H- and L-levels, respectively. High-order decode signal XL is fixed to the L-level. In this state, MOS transistors 37, 38 and 39 are off, and MOS transistor 36 is on. Therefore, MOS transistor 36 fixes voltage VG on node 25 at the H-level of voltage VCC. Thereby, resistance element 20 and MOS transistors 31 and 32 maintain voltage VDDR on driver power supply line 11 at the voltage level lower than voltage VDD. This state corresponds to the structure of the first embodiment.

(iii) Mode MODE_C

In this mode, both control signals P1 and P2 are set to the H-level. High-order decode signal XL is set to the H- or L-level according to the result of decoding of the provided row address signal. Thus, high-order decode signal XL is set to the L-level when the corresponding row block is selected, and is kept at the H-level when the corresponding row block is in the unselected state (including a standby state).

In this state, MOS transistor 37 is on, MOS transistor 39 is off, and MOS transistors 36 and 38 are selectively turned on and off according to high-order decode signal XL. When the corresponding row block is selected, MOS transistor 36 is on, and MOS transistor 38 is off. Therefore, the voltage divider circuit provided by resistance elements 26 and 28 sets voltage VG on node 25, and thereby the pull-down circuit (including transistors 31 and 32 as well as resistance elements 28 and 26) sets word line driver power supply voltage VDDR to the voltage level lower than voltage VDD.

When the corresponding row block is in the unselected state (including the standby state), MOS transistor 38 is on, and MOS transistor 36 is off so that voltage VG on node 25 keeps the L-level (ground voltage level). Therefore, MOS transistor 31 is turned off. In this unselected state, therefore, the path of the through current in resistance element 20 and pull-down transistors 31 and 32 is interrupted. Also, the path of the through current in resistance elements 26 and 28 is interrupted because MOS transistor 36 is off.

Thereby, gate voltage VG of pull-down transistor 31 is set to the voltage level divided by the resistance voltage-divider circuit (resistance elements 26 and 28), and word line driver power supply voltage VDDR at the shifted level is transmitted onto the selected word line.

The foregoing modes are set according to the quantity of variations of the threshold voltage in the semiconductor memory device, whereby the driver power supply voltage can be adjusted to attain the optimum value according to the degree of variations in each process.

Figure 20:
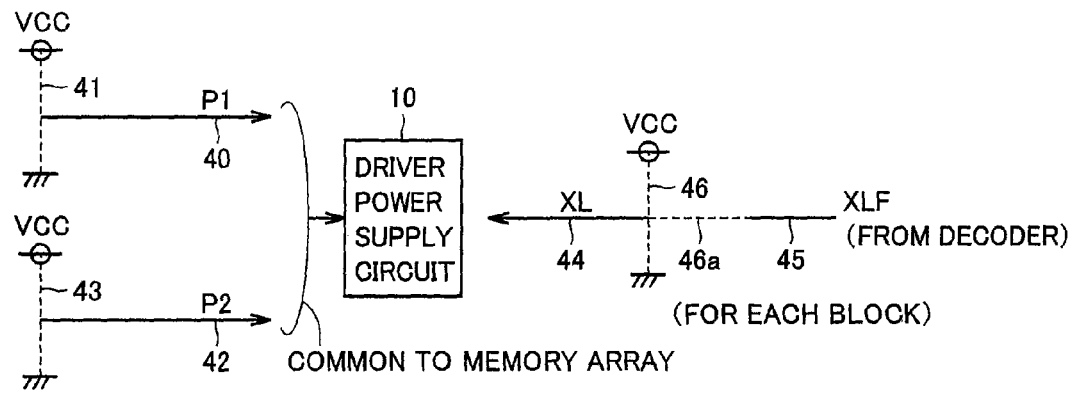
FIG. 20 shows by way of example a structure of a unit generating the control signal shown in FIG. 18.

FIG. 20 shows an example of a structure producing control signals P1 and P2 as well as high-order decode signal XL. In FIG. 20, a control signal line 40 transmitting control signal P1 is coupled via a mask interconnection 41 to the power supply node or the ground node according to the mode. A control signal line 42 transmitting control signal P2 is likewise coupled via a mask interconnection 43 to the power supply node or the ground node according to the mode. These control signal lines 40 and 42 are provided commonly to the driver power supply circuit in the memory array.

A high-order decode line 44 transmitting high-order decode signal XL is coupled via a mask interconnection 46 to one of the power supply node, the ground node or a decode output line 45. Mask interconnection 46 has a mask interconnection 46a that is located between high-order decode line 44 and decode output line 45, and is arranged for each row block (i.e., for each block of 32 word lines). Thereby, high-order decoder signal XL can be set according to the mode to one of an H-level-fixed state, an L-level-fixed state and a state that is variable depending on a high-order decode signal XLF provided from the decoder.

In the structure shown in FIG. 20, mask interconnections 41, 43 and 46 may be replaced with switching elements, and the connection path of control signal-lines 40, 42 and 44 may be set by selective on/off of the switching elements.

In mode MODE_A, MOS transistor 39 is turned on according to control signal P1. In this case, control signal P1 may be set to the H- or L-level according to the standby state and select/unselect state. Likewise, in mode MODE_B, control signal P2 may be set to the H- or L-level according to the high-order decode signal (and, more specifically, may be set to the H-level in the standby state and the unselect state, and to the L-level in the select state). When the states of control signals P1 and P2 are set to the H- or L-level according to select/unselect of the corresponding row block, control signals P1 and P2 in each row block must be set to the states according to the high-order decode signal independently of the other row blocks.

Figure 21:
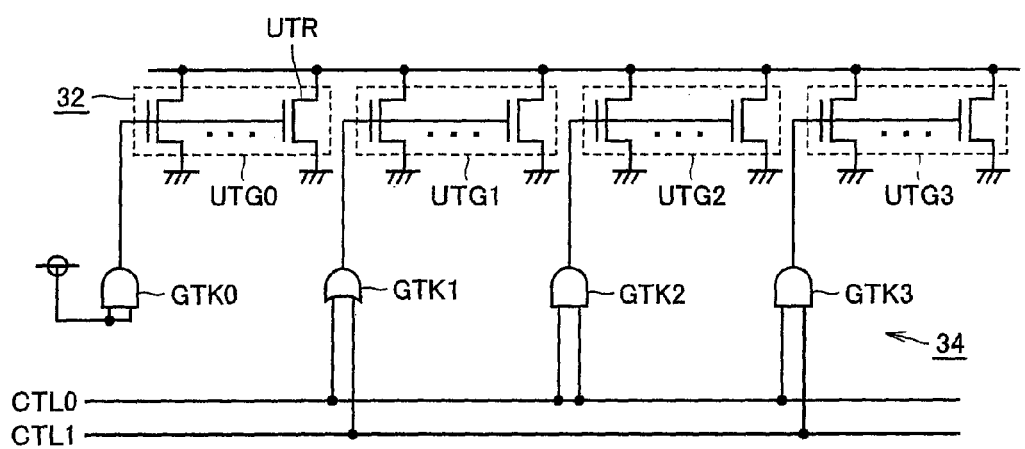
FIG. 21 shows by way of example a switch circuit of a pull-down transistor shown in FIG. 18.

FIG. 21 schematically shows, by way of example, structures of MOS transistor 32 and switch circuit 34 shown in FIG. 18. In FIG. 21, MOS transistor 32 includes a parallel connection of a plurality of (i.e., four) unit transistor groups UTG0-UTG3. Each of unit transistor groups UTG0-UTG3 includes unit transistors UTR connected together in parallel. Unit transistor UTR has substantially the same structure and size as the memory cell transistor (and these are formed in the same manufacturing step). Gate circuits GTK0-GTK3 are arranged for unit transistor groups UTG0-UTG3, respectively. Each of gate circuits GTK0-GTK3 corresponds to switch circuit 34 shown in FIG. 18.

Gate circuit GTK0 is formed of an AND gate receiving the power supply voltage (VCC) on its opposite inputs. Gate circuit GTK1 is formed of an OR gate receiving control signals CTL0 and CTL1. Gate circuit GTK2 is formed of an AND gate receiving control signal CTL0 on its opposite inputs. Gate circuit GTK3 is formed of an AND circuit receiving control signals CTL0 and CTL1.

In the structure of MOS transistor 32 shown in FIG. 21, the following four states can be achieved according to control signals CTL0 and CTL1.

(i) CTL0=CTL1=0 (=L-level)

In this state, all the output signals of gate circuits GTK1-GTK3 are at the L-level, and all unit transistors UTR in unit transistor groups UTG1-UTG3 are off. The output signal of gate circuit GTK0 is at the H-level, and all unit transistors UTR in unit transistor group UTG0 are on. In this state, therefore, MOS transistor 32 is formed of unit transistor group UTG0.

(ii) CTL0=0 and CTL1=1

In this state, the output signal of gate circuit GTK1 is at the H-level. Both the output signals of gate circuits GTK2 and GTK3 are at the L-level. Therefore, unit transistors UTR in unit transistor groups UTG0 and UTG1 are on.

(iii) CTL0=1 and CTL1=0

In this state, the output signals of gate circuits GTK0-GTK2 are at the H-level, and unit transistors UTR in unit transistor groups UTG0-UTG2 are turned on. The output signal of gate circuit GTK3 is at the L-level, and unit transistors UTR in unit transistor group UTG3 are off.

(iv) CTL0=CTL1=1

In this state, all the output signals of gate circuits GTK0-GTK3 are at the H-level, and all unit transistors UTR in unit transistor groups UTG0-UTG3 are off.

The channel width of MOS transistor 32 can be selectively set to four values by setting the logical values of control signals CTL0 and CTL1, and thereby the drive current quantity of MOS transistor 32 can be adjusted. By this current quantity adjustment, it is possible to adjust the driver power supply voltage that is pulled down according to the changes in characteristics of the memory cell transistor, and the optimum responsibility can be set with respect to the variations in threshold voltage so that the semiconductor memory device may operate stably.

Control signals CTL0 and CTL1 may be produced, e.g., by programming the fuse elements, or by fixing potentials of specific bonding pads by bonding wires. Also, the voltage levels of control signals CTL0 and CTL1 may be set using mask interconnections.

Gate circuits GTK0-GTK3 in switch circuit 34 may be shared among the driver power supply circuits arranged in the respective row blocks of the memory array.

Figure 22:
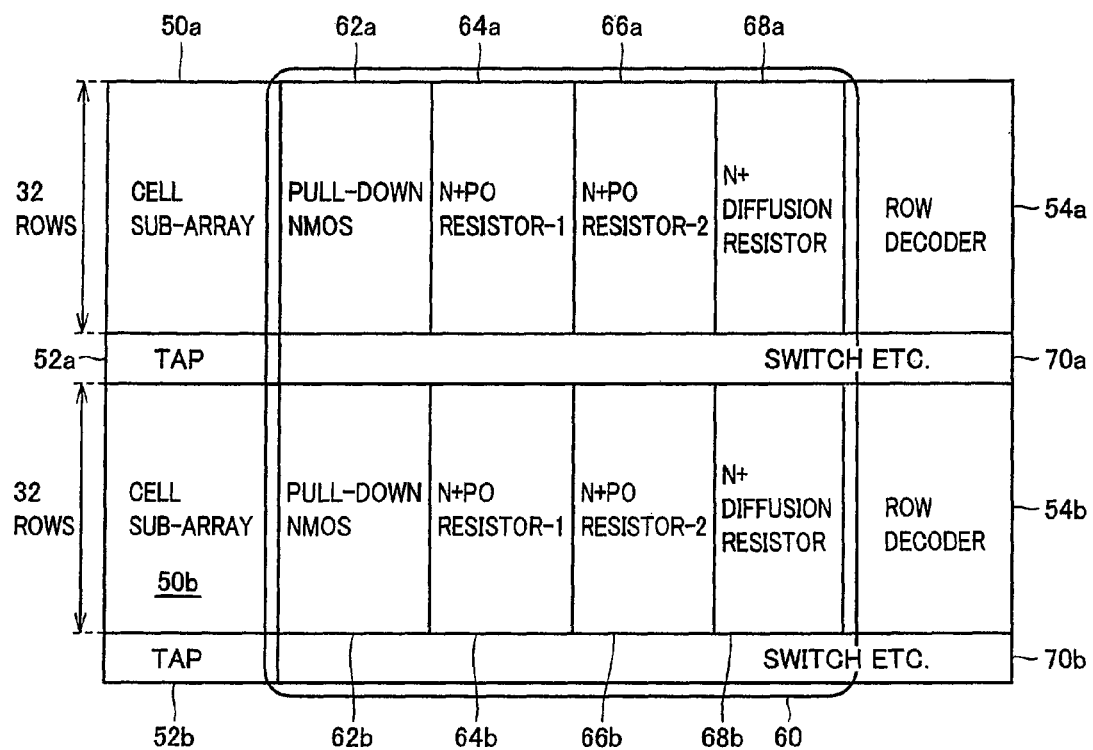
FIG. 22 schematically shows a structure of an array of a semiconductor memory device according to a sixth embodiment of the invention.

FIG. 22 schematically shows an arrangement of the semiconductor memory device on the chip according to the sixth embodiment of the invention. In FIG. 22, the memory cell array is divided into cell sub-arrays 50a and 50b each having memory cells in 32 rows. Tap regions 52a and 52b are arranged between cell sub-arrays 50a and 50b for setting a substrate potential (well potential).

Row decoders 54a and 54b are arranged corresponding to cell sub-arrays 50a and 50b for selecting the rows (word lines) in cell sub-arrays 50a and 50b, respectively. Word line drivers are also arranged in respective regions indicated by 54a and 54b. A driver power supply circuit arrangement region 60 is arranged between cell sub-arrays 50a and 50b and row decoders 54a and 54b.

In driver power supply circuit arrangement region 60, the driver power supply circuits are arranged corresponding to row decoders 54a and 54b, respectively. A pull-down NMOS arrangement region 62a, an N+ polycrystalline silicon (N+PO) resistor-1 arrangement region 64a, an N+ polycrystalline silicon resistor-2 arrangement region 66a and an N+ diffusion resistor arrangement region 68a are arranged between cell sub-array 50a and row decoder 54a. A pull-down NMOS arrangement region 62b, an N+ polycrystalline silicon (N+PO) resistor-1 arrangement region 64b, an N+ polycrystalline silicon resistor-2 arrangement region 66b and an N+ diffusion resistor arrangement region 68b are arranged between cell sub-array 50b and row decoder 54b.

The pull-down NMOS corresponds to N-channel MOS transistors 31 and 32 shown in FIG. 18. The N+ polycrystalline silicon resistor-1 corresponds to resistance element 26 shown in FIG. 18. The N+ polycrystalline silicon resistor-2 corresponds to resistance element 20 shown in FIG. 18. The N+ diffusion resistor corresponds to resistance element 28 shown in FIG. 18.

In driver power supply circuit arrangement region 60, peripheral switch arrangement regions 70a and 70b are arranged corresponding to tap regions 52a and 52b, respectively. In peripheral switch arrangement regions 70a and 70b, there are arranged P-channel MOS transistors 36 and 39 as well as N-channel MOS transistors 37 and 38 in the driver power supply circuit shown in FIG. 18.

As shown in FIG. 22, the memory cell array is usually provided with tap regions 52a and 52b arranged corresponding to the respective cell sub-arrays each having 32 rows for fixing the substrate potential. Well isolation is performed in the regions corresponding to tap regions 52a and 52b, and a gap region is present between row decoders 54a and 54b. Peripheral switches such as switching transistors are arranged using this gap region, whereby increase in area of the memory cell array can be suppressed. The driver power supply circuit is adjacent to cell sub-arrays 50a and 50b, whereby the pull-down NMOS, N+ polycrystalline silicon non-silicide resistor and N+ diffusion resistor can be arranged in the same layout as the memory cells. Variations in size due to shifting of a mask of the memory cells likewise occur in this driver power supply circuit arrangement region 60, and the components of the driver power supply circuit in driver power supply circuit arrangement region 60 can accurately reflect the variations in manufacturing parameter of the transistor elements in the memory cell.

Figure 23:
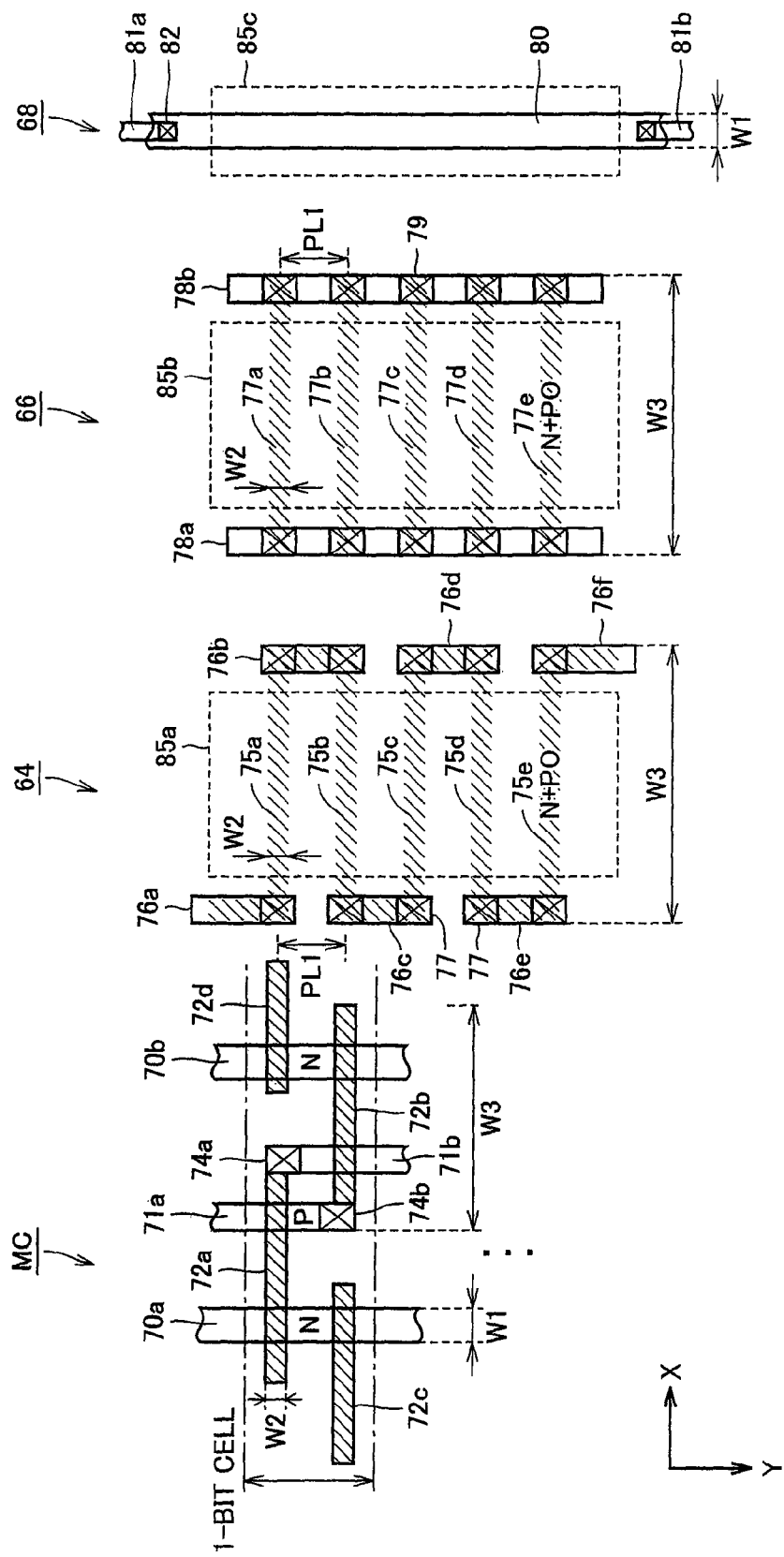
FIG. 23 schematically shows a plane layout of respective components in a chip arrangement shown in FIG. 22.

FIG. 23 schematically shows a plane layout of the circuit arrangement shown in FIG. 22. FIG. 23 shows a plane layout of an active region (diffusion layer) and a gate electrode of one-bit memory cell MC in the memory sub-array. N+ polycrystalline silicon resistor-1 arrangement regions 64a and 64b have the same plane layout, N+ polycrystalline silicon resistor-2 arrangement regions 66a and 66b have the same plane layout, and N+ diffusion resistor arrangement regions 68a and 68b have the same plane layout. Therefore, reference numbers 64, 66 and 68 in FIG. 23 indicate one N+ polycrystalline silicon resistor-1 arrangement region, one N+ polycrystalline silicon resistor-2 arrangement region and one N+ diffusion resistor arrangement region, respectively.

In FIG. 23, memory cell MC includes N-type impurity regions (active regions) 70a and 70b each continuously extending in the Y-direction, and active regions 71a and 71b extending in the Y-direction and arranged between active regions 70a and 70b. Active regions 71a and 71b are P-type impurity regions (diffusion regions). Active regions 71a and 71b extend in the memory cell. Active regions 70a and 70b continuously extend in the Y-direction, and are shared among the plurality of memory cells.

Memory cell MC further includes a gate electrode 72a extending in the X-direction and crossing active regions 71b and 71a, a gate electrode interconnection 72b extending in the X-direction and crossing active regions 71b and 72b, a gate electrode interconnection 72d extending in the X-direction and crossing active region 70b, and a gate electrode interconnection 72c crossing active region 70a. Gate electrode interconnection 72a is coupled to active region 71b via a shared contact 74a, and gate electrode interconnection 72b is coupled to active region 71a via a shared contact 74b.

The shared contacts have functions of both the contact and the interconnection, and electrically couples active regions 71a and 71b directly to gate electrode interconnections 72b and 72a, respectively. The formation of shared contacts 74a and 74b provides the storage node in the memory cell.

Gate electrode interconnections 72a and 72d are aligned in the X-direction, and gate electrode interconnections 72c and 72b are aligned in the X-direction. Each of active regions 70a and 70b has a width of W1 in the X-direction, and the access and drive transistors are formed in this region.

Each of gate electrode interconnections 72a-72d has a width of W2 in the Y-direction and a length of W3 in the X-direction. This width W2 in the Y-direction of the gate electrode interconnection defines the channel lengths of the access and drive transistors in the memory cell. Width W1 of active regions 70a and 70b defines the channel width of the memory cell transistor.

Gate electrode interconnections 72a and 72d are spaced from gate electrode interconnections 72c and 72b by a distance (pitch) of PL1. Memory cells MC are arranged such that the layouts described above are symmetrical in the X- and Y-directions.

In N+ polycrystalline silicon resistance-1 arrangement region 64, N+ doped polycrystalline silicon interconnections 75a-75e are arranged with the same line width, line length and pitch as gate electrode interconnections 72a-72d in memory cell MC. Each of polycrystalline silicon interconnections 75a-75e has opposite ends connected to the neighboring ends of the different interconnections so that these polycrystalline silicon interconnections form a zigzag pattern. Polycrystalline silicon interconnections 75a-75e are connected together via contacts 77 in the regions continuously extending in the Y-direction by metal interconnections 76a-76f formed of silicide (cobalt silicide or nickel silicide) in an upper layer. The zigzag form of polycrystalline silicon interconnections 75a-75e achieves a large resistance value. An anti-silicide mask (anti-silicide film) 85a (i.e., a mask or a film for preventing siliciding) is formed above polycrystalline silicon interconnections 75a-75e. In a siliciding step for the gate electrode interconnections of the memory cell transistors, anti-silicide mask 85a prevents the siliciding of polycrystalline silicon interconnections 75a-75e.

Each of polycrystalline silicon interconnections 75a-75e has a length of W3 in the X-direction and a length of W2 in the Y-direction. Therefore, polycrystalline silicon interconnections 75a-75e having the same sizes as gate electrode interconnections 72a-72d in memory cell MC are arranged at the same pitch as them.

In N+ polycrystalline silicon resistor-2 arrangement region 66, N+ doped polycrystalline silicon interconnections 77a-77e are successively arranged in the Y-direction at the same pitch PL1 as gate electrode interconnections 72a-72d. Each of polycrystalline silicon interconnections 77a-77e is connected at its opposite ends to silicide interconnections 78a and 78b via contacts 79, respectively. An anti-silicide mask 85b is likewise arranged in region 66 to prevent the siliciding of polycrystalline silicon interconnections 77a-77e.

In N+ polycrystalline silicon resistor-2 arrangement region 66, each of polycrystalline silicon interconnections 77a-77e has a length of W3 in the X-direction and a width of W2 in the Y-direction. Silicide interconnections 78a and 78b connect opposite ends of polycrystalline silicon interconnections 77a-77e together so that polycrystalline silicon interconnections 77a-77e are arranged in parallel to reduce the resistance value of the resistance element formed in N+ polycrystalline silicon resistor-2 arrangement region 66.

In N+ diffusion resistor arrangement region 68, a diffusion region (active region) 80 continuously extends in the Y direction. Active region 80 has the same width W1 in the X direction as active regions 70a and 70b in memory cell MC, and has the same impurity concentration. Anti-silicide masks 85c are arranged at predetermined regions in active region 80, and are mutually connected via contacts 82 and through a shield insulating film to the neighboring diffusion regions by interconnections 81a and 81b. In a structure having diffusion region 80 that continuously extends in the Y direction, interconnections 81a and 81b are not generally employed, and anti-silicide mask 85c continuously extends in the Y direction. In the illustrated example, the field insulating film isolates diffusion region 80 from each other at predetermined intervals to follow various layouts of memory cells.

Diffusion region (active region) 80 has the width of W1 in the X-direction, which is equal to width W1 in the X-direction of each of active regions 70a and 70b in memory cell MC. Also, diffusion region 80 has the same impurity concentration (implantation dose) as active regions 70a and 70b.

Therefore, the components having the same size and the same impurity concentration as the corresponding components in memory cell MC are formed in regions 64, 66 and 68 through the same steps as those in memory cell MC, whereby the variations in shape or form due to the mask shifting in memory cell MC affect the components in regions 64, 66 and 68 to the same extent as those in memory cell MC. Therefore, the components in regions 64, 66 and 68 can accurately reflect the variations in electric characteristics of the transistors in memory cell MC so that driver power supply voltage VDDR can be set accurately according to the memory cell characteristics.

Figure 24:
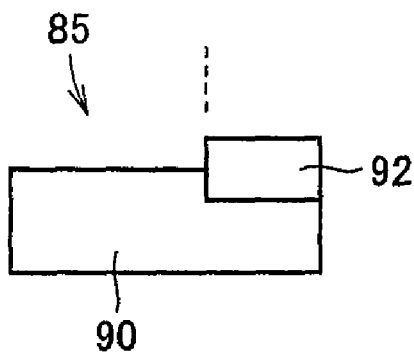
FIG. 24 schematically shows a sectional structure of a polycrystalline silicon interconnection in a silicided region and an anti-silicide region shown in FIG. 23.

FIG. 24 schematically shows a sectional structure of the N+ doped polycrystalline silicon interconnection near the anti-silicide region. As shown in FIG. 24, a polycrystalline silicon interconnection 90 in an anti-silicide region 85 is formed of N+ doped polycrystalline silicon 90. In a region outside anti-silicide region 85, metal such as cobalt or nickel is layered, and then siliciding is performed to form a silicide layer 92. The gate electrode of the memory cell transistor is usually the polycrystalline silicon interconnection thus silicided. This structure reduces the resistance of the gate electrode as well as the threshold voltage of the MOS transistor. The silicide gate electrode is usually formed in a manner that polycrystalline silicon is deposited and processed, and then metal such as cobalt or nickel is diffused to cause a siliciding reaction over a whole region reaching an interface with respect to the gate insulating film.

FIG. 24 shows an example in which silicide film 92 is formed only in a part of polycrystalline silicon interconnection 90. However, the polycrystalline silicon interconnection may be fully or entirely silicided. In this full-silicide gate electrode structure, the gate electrode of the memory cell transistor has a silicided portion extending to a boundary to the gate insulating film.

Although not clearly shown, the active region of the memory cell transistor has a silicided layer at its surface. In N+ diffusion resistance arrangement region 68, the silicide layer is not formed at the surface of active region 80.

When each resistance for pull-down is formed through the completely same steps as the memory cell, the silicided resistance element is used as the resistance element so that the resistance value cannot be increased sufficiently. Therefore, a non-silicide resistance is used.

Figure 25:
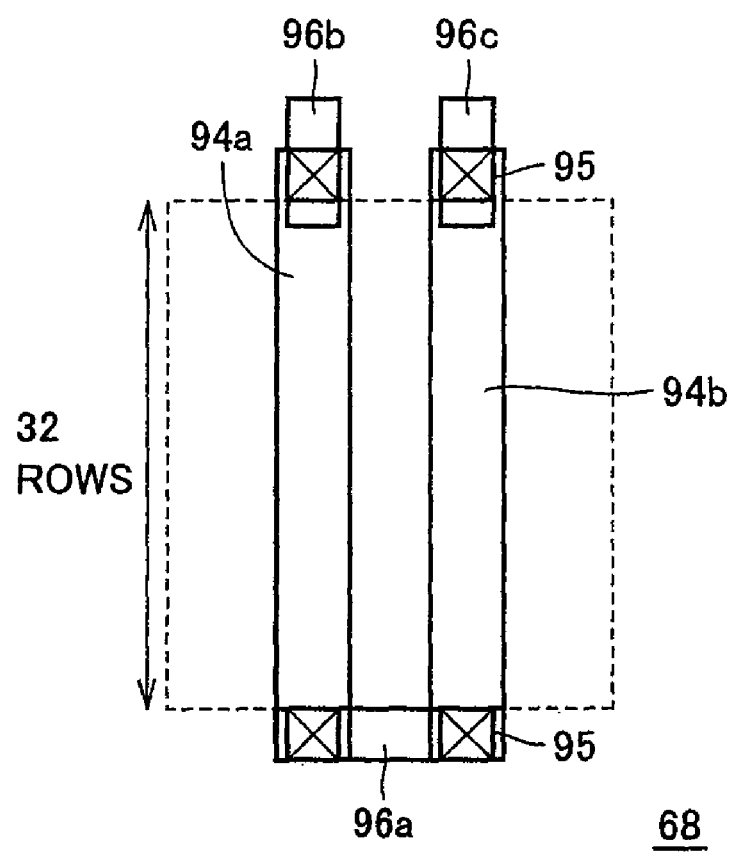
FIG. 25 shows a modification of a diffusion resistor shown in FIG. 23.

FIG. 25 schematically shows another layout of N+ diffusion resistance arrangement region 68. In FIG. 25, active regions (diffusion regions) 94a and 94b are arranged with a space therebetween, and each continuously extend over the row block of 32 rows. These active regions 94a and 94b are mutually connected via contacts 95 by a metal interconnection 96a in a lower region. Active regions 94a and 94b are connected via contacts 95 by metal interconnections 96b and 96c in an upper region. In this manner, the opposite electrodes of the diffusion resistance element are formed.

As shown in FIG. 25, active regions 94a and 94b are continuously arranged in the region of the word lines in 32 rows, and this structure corresponds to the structure in which active regions 70a and 70b continuously extend in the Y-direction in memory cell MC shown in FIG. 23.

In this case, active regions 94a and 94b have the same width W1 as active regions 70a and 70b of memory cell MC, are arranged at the same pitch (in the X-direction) as active regions 70a and 70b located between the neighboring memory cells and have the same impurity concentration as access transistors 70a and 70b.

Similarly to the case already discussed, parameters of the memory cell vary depending on the mask shifting of the mask of memory cell MC or the variations in impurity concentration, and these variations in parameter may be reflected in the width or the impurity concentration of diffusion layers (active regions) 94a and 94b.

A plane layout of the pull-down transistor (i.e., the transistor for pull-down) is not shown. Unit transistors of the pull-down transistor are arranged according to the same plane layout as the memory cell transistors. Since the unit transistors are formed in 32 rows, a required number of unit transistors can be arranged.

According to the sixth embodiment of the invention, as described above, driver power supply circuit is configured to interrupt the path of the through current during the standby or the unselected state so that the power consumption can be reduced. The driver power supply circuits are arranged corresponding to the respective row blocks so that a total footprint of the driver power supply circuits can be reduced.

The driver power supply circuit is arranged in each region between the memory cell arrangement region (memory cell sub-array) and the corresponding row-decoder, and each transistor in the driver power supply circuit can be adjacent to the memory cell. Therefore, the components of the driver power supply circuit can accurately reflect the variations in transistor parameter of the memory cell, and can have the characteristics that follow the variations in characteristics of the transistors in the memory cell. Further, the components of the driver power supply circuit are arranged using a tap region applying a fixed potential to the substrate region, and this structure can sufficiently suppress the increase in a footprint of the memory cell array that may be caused by arrangement of the driver power supply circuit.

The resistance element and the diffusion resistor are aligned in the same direction as the corresponding element in the transistors of the memory cell, and the transistors which are the components of this driver power supply circuit can accurately reflect the parameter variations of the memory cell.

Seventh Embodiment

Figure 26:
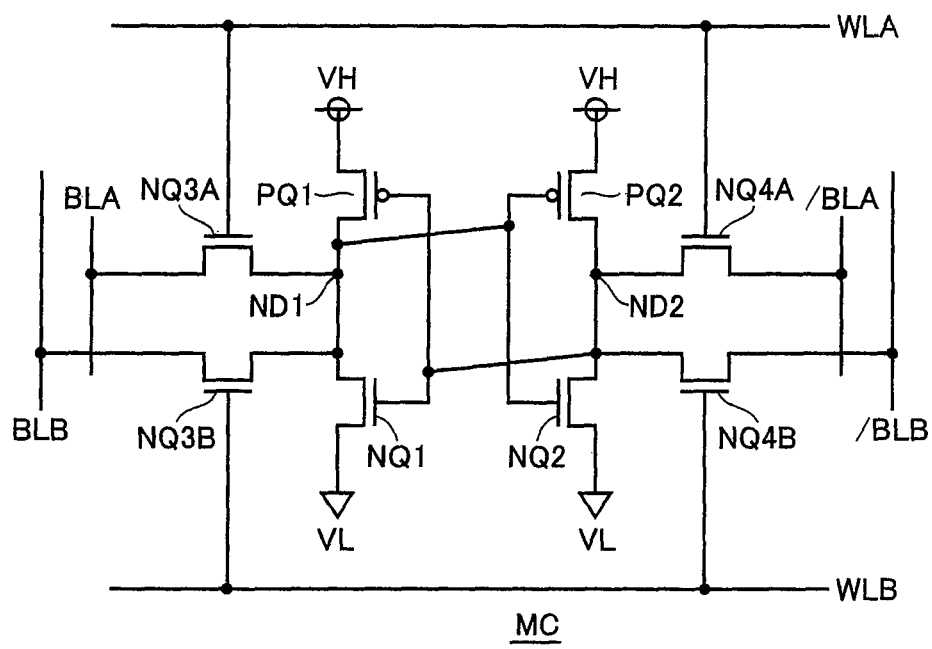
FIG. 26 shows a structure of a memory cell in a semiconductor memory device according to a seventh embodiment of the invention.

FIG. 26 shows an example of the structure of the memory cell in the semiconductor memory device according to the seventh embodiment of the invention. Similarly to memory cell MC shown in FIG. 2, memory cell MC in FIG. 26 includes P- and N-channel MOS transistors PQ1 and NQ1 forming a CMOS inverter, and P- and N-channel MOS transistors PQ2 and NQ2 forming another CMOS inverter. These transistors PQ1, PQ2, NQ1 and NQ2 form a CMOS inverter latch that stores complementary data on storage nodes ND1 and ND2.

Memory cell MC further includes N-channel MOS transistors NQ3A and NQ4A coupling storage nodes ND1 and ND2 to bit lines BLA and /BLA according to a signal level on a word line WLA, respectively, and N-channel MOS transistors NQ3B and NQ4B coupling bit lines BLB and /BLB to storage nodes ND1 and ND2 according to a signal level on a word line WLB, respectively.

Memory cell MC shown in FIG. 26 is a two-port memory cell, and couples storage nodes ND1 and ND2 to bit lines BLA and /BLA, respectively, when a word line WLA is selected. When a word line WLB is selected, it couples storage nodes ND1 and ND2 to bit lines BLB and /BLB, respectively. Therefore, the reading/writing of data can be performed in parallel by selecting word lines WLA and WLB via different ports, respectively. For each port, word lines WLA and WLB as well as bit line pair BLA and /BLA and bit line pair BLB and /BLB are arranged. In the whole structure of this two-port memory cell, the structure in the semiconductor memory device shown in FIG. 1 is arranged as a peripheral circuit for each of ports A and B.

Figure 27:
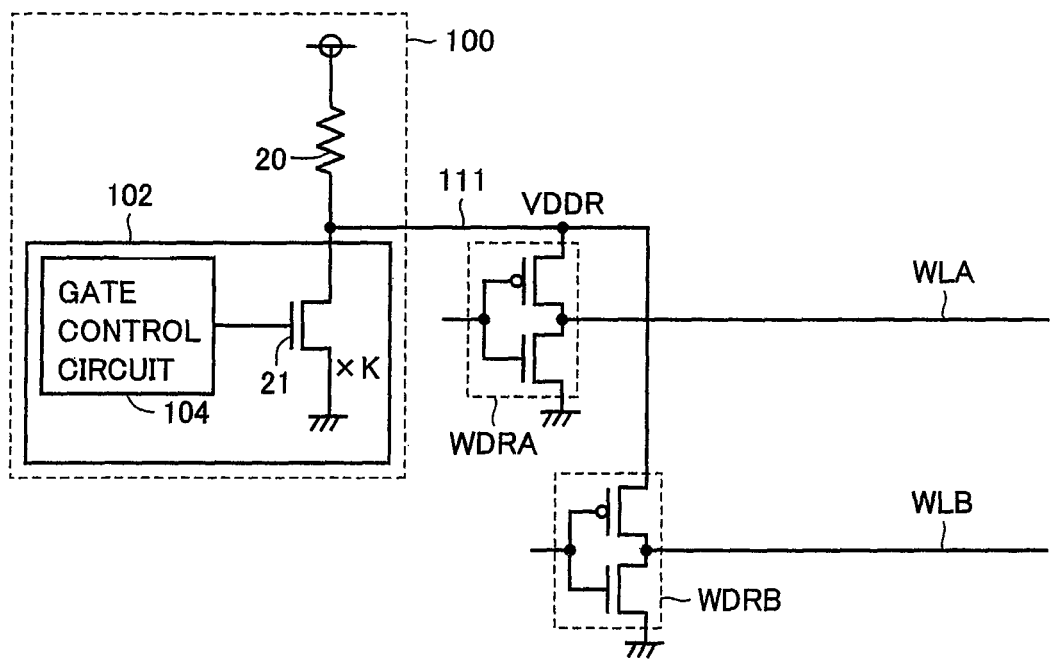
FIG. 27 schematically shows a structure of a driver power supply circuit according to a seventh embodiment of the invention.

FIG. 27 schematically shows a structure of the driver power supply circuit according to the seventh embodiment of the invention. FIG. 27 representatively shows word line WLA of port A and word line WLB of port B. Word line drivers WDRA and WDRB are arranged corresponding to word lines WLA and WLB, respectively.

The structure includes a driver power supply circuit 100 shared between word line drivers WDRA and WDRB. Driver power supply circuit 100 includes resistance element 20 that is connected between the power supply node and a driver power supply line 111. Similarly to the first to sixth embodiments, resistance element 20 is a heavily doped N-type doped polycrystalline silicon interconnection, and is preferably a non-silicide resistance element.

Driver power supply circuit 100 further includes an N-channel MOS transistor 21 having the same threshold voltage characteristics, as the driver or access transistor in the memory cell (not shown in FIG. 27), and a pull-down circuit 102 lowering the voltage level of driver power supply line 111. Pull-down circuit 102 further includes a gate control circuit 104 controlling a gate potential of pull-down transistor 21. Gate control circuit 104 has any one of the structures in the first to sixth embodiments. Depending on the threshold voltage variations of the access or drive transistor in the memory cell, the voltage level of driver power supply voltage VDDR is adjusted through the gate potential of the pull-down transistor.

As shown in FIG. 27, driver power supply circuit 100 shared among the word lines in 32 rows is arranged for each of ports A and B, similarly to the sixth embodiment. Driver power supply circuit 100 can be arranged for sharing between ports A and B so that increase in footprint of the memory cell array can be suppressed.

The operation and effect of driver power supply circuit 100 shown in FIG. 27 are the same as those already described in the first to sixth embodiments.

The SRAM may have ports more than two. The driver power supply circuit is arranged for sharing among all the ports.

According to the seventh embodiment of the invention, as described above, the multi-port SRAM is provided with the driver power supply circuit shared among all the ports so that the increase in array area can be suppressed, and the variations in threshold voltage of the memory cell transistor can be suppressed. Therefore, the word line voltage can be set to the accurate voltage level, and deterioration of the write characteristics and the read current characteristics can be prevented.

Eighth Embodiment

Figure 28:
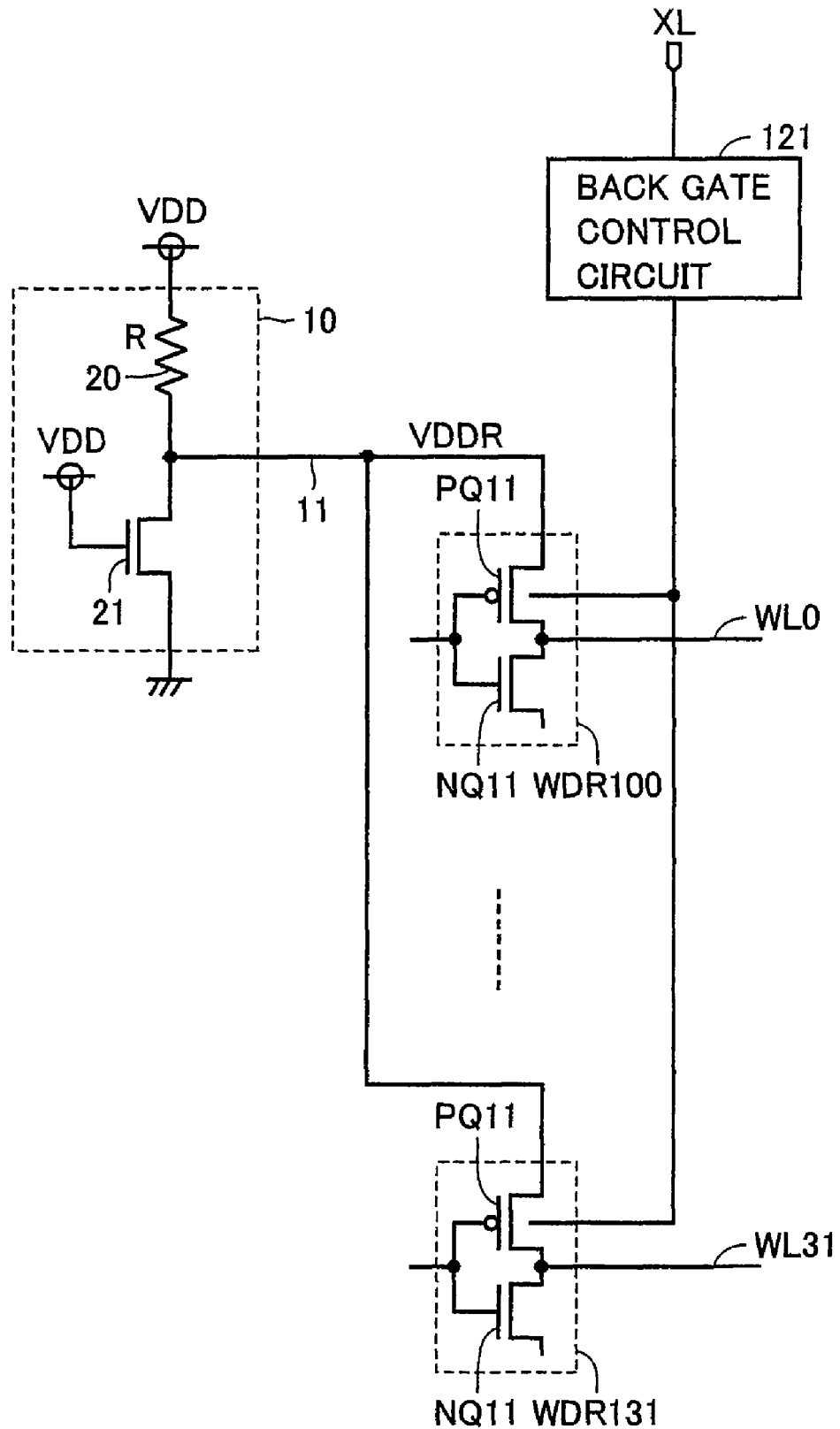
FIGS. 28-31 show major structures of semiconductor memory devices according to eighth to eleventh embodiments of the invention, respectively.

FIG. 28 shows a major structure of a semiconductor memory device according to an eighth embodiment of the invention.

In FIG. 28, driver power supply circuit 10 is arranged for sharing by a set of word lines WL0-WL31. More specifically, driver power supply line 11 extending from driver power supply circuit 10 is commonly coupled to word line drivers WDR100-WDR131 arranged corresponding to respective word lines WL0-WL31. This semiconductor memory device includes a back gate control circuit 121. Word line driver WDR100 will now be described as a representative example.

Driver power supply circuit 10 includes resistance element 20 connected between the power supply node and driver power supply line 11, and also includes pull-down transistor 21 connected between driver power supply line 11 and the ground node. Resistance element 20 and pull-down transistor 21 have the same structures as these in the first embodiment.

Word line driver WDR100 includes a P-channel MOS transistor PQ11 and an N-channel MOS transistor NQ11. P- and N-channel MOS transistors PQ11 and NQ11 form a CMOS inverter.

P-channel MOS transistor PQ11 has a source connected to resistance element 20 in driver power supply circuit 10 and a drain of pull-down transistor 21. Thus, P-channel MOS transistor PQ11 receives driver power supply voltage VDDR on its source. A drain of P-channel MOS transistor PQ11 is connected to a drain of N-channel MOS transistor NQ11 and word line WL0, and a back gate thereof is connected to an output of back gate control circuit 121. A gate of P-channel MOS transistor PQ11 is connected to a gate of N-channel MOS transistor NQ11.

Back gate control circuit 121 controls the back gate potential of P-channel MOS transistor PQ11 according to high-order decode signal XL. More specifically, when the corresponding row block is not selected, back gate control circuit 121 sets the back gate potential of power supply voltage VDD in P-channel MOS transistor PQ11. When the corresponding row block is selected, back gate control circuit 121 sets the back gate potential smaller than power supply voltage VDD in P-channel MOS transistor PQ11.

When the back gate potential of P-channel MOS transistor PQ11 decreases to a positive voltage equal to or lower than the built-in voltage, the back gate effect lowers the threshold voltage of P-channel MOS transistor PQ11. Thereby, the drive capability of P-channel MOS transistor PQ11 can be increased so that the speed of P-channel MOS transistor PQ11 can be increased.

Since driver power supply circuit 11 is connected to the plurality of word line drivers WDR100-WDR131, driver power supply line 11 has a large parasitic capacitance. It may be envisaged that the back gate of P-channel MOS transistor PQ11 is connected to driver power supply line 11 to increase the speed of P-channel MOS transistor PQ11 as compared with a structure in which the back gate of P-channel MOS transistor PQ11 is fixed at power supply voltage VDD. However, the above structure having the back gate connected to driver power supply line 11 further increases the parasitic capacitance of driver power supply line 11, and overshoot of word line WL occurs when P-channel MOS transistor PQ11 changes from the off state to the on state.

In the semiconductor memory device according to the eighth embodiment of the invention, however, the back gate of P-channel MOS transistor PQ11 included in word line driver WDR is connected to back gate control circuit 121. This structure can prevent the increase in parasitic capacitance of driver power supply line 11 so that the overshoot of word line WL can be reduced.

In the semiconductor memory device according to the eighth embodiment of the invention, since it is merely required to control the back gate potential of P-channel MOS transistor PQ11 a row block at a time, the region required for substrate isolation can be small so that the area of the semiconductor memory device can be small.

Other structures and operations are the same as those of the first embodiment, and therefore detailed description thereof is not repeated.

Ninth Embodiment

Figure 29:
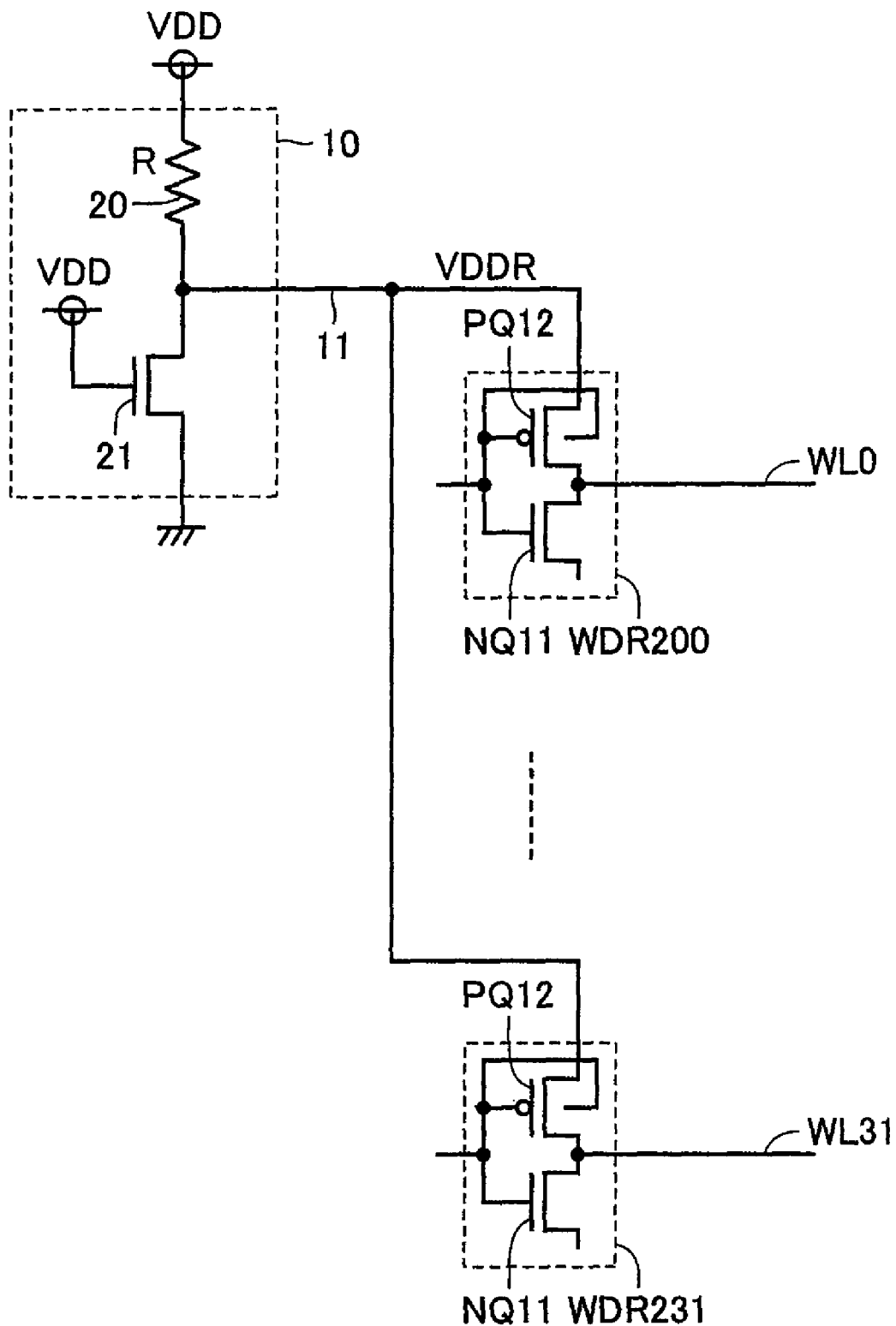

FIG. 29 shows a major structure of a semiconductor memory device according to a ninth embodiment of the invention.

In FIG. 29, driver power supply circuit 10 is arranged for sharing among word lines WL0-WL31. More specifically, driver power supply line 11 extending from driver power supply circuit 10 is commonly coupled to word line drivers WDR200-WDR231 provided corresponding to respective word lines WL0-WL31. Word line driver WDR200 will now be described representatively.

Word line driver WDR200 includes a P-channel MOS transistor PQ12 and an N-channel MOS transistor NQ11. P-channel MOS transistor PQ12 and N-channel MOS transistor NQ11 form a CMOS inverter.

P-channel MOS transistor PQ12 is a DTMOS (Dynamic Threshold MOS). More specifically, P-channel MOS transistor PQ12 has a back gate and a gate connected together. A source of P-channel MOS transistor PQ12 is connected to resistance element 20 in driver power supply circuit 10 and drain of pull-down transistor 21. Thus, driver power supply voltage VDDR is applied to the source of P-channel MOS transistor PQ12. A drain of P-channel MOS transistor PQ12 is connected to the drain of N-channel MOS transistor NQ11 and word line WL0. The gate of P-channel MOS transistor PQ12 is connected to the gate of N-channel MOS transistor NQ11.

P-channel MOS transistor PQ12 has an SOI (Silicon On Insulator) structure. Thus, the semiconductor memory device includes a silicon substrate, a buried oxide film that is an insulating film formed on the silicon substrate, and an active layer formed on the oxide film. A semiconductor region of P-channel MOS transistor PQ12 and an STI (Shallow Trench Isolation) region are formed in the active layer. Thereby, the back gate potentials of the P-channel MOS transistors in the plurality of word line drivers WDR can be controlled independently.

When a voltage at the logical L-level is applied to the gate of P-channel MOS transistor PQ12, the back gate potential attains the logical L-level so that the back gate effect lowers the threshold voltage of P-channel MOS transistor PQ12. Thereby, the drive capability of P-channel MOS transistor PQ12 can be increased so that the speed of P-channel MOS transistor PQ12 can be increased.

Conversely, when a voltage at the logical H-level is applied to the gate of P-channel MOS transistor PQ12, the back gate potential attains the logical H-level so that a potential difference between the source and back gate of P-channel MOS transistor PQ12 is small, and the back gate effect does not occur. Thereby, it is possible to prevent an unnecessary flow of a leak current in P-channel MOS transistor PQ12.

It is not necessary to employ back gate control circuit 121 that is required in the semiconductor memory device according to the eighth embodiment, and the semiconductor memory device can have small sizes.

Other structures and operations are the same as those of the first embodiment, and therefore detailed description thereof is not repeated.

Tenth Embodiment

Figure 30:
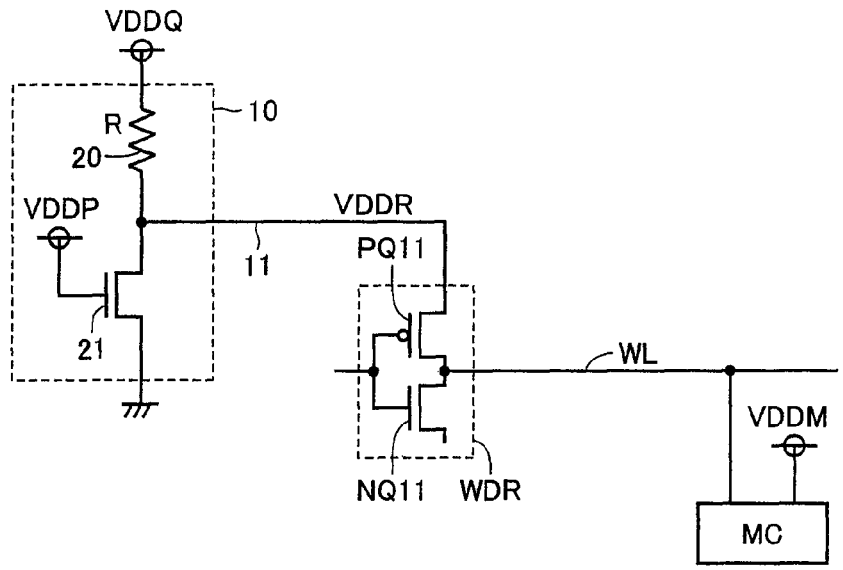

FIG. 30 shows a major structure of a semiconductor memory device according to a tenth embodiment of the invention.

In FIG. 30, driver power supply circuit 10 includes resistance element 20 connected between the power supply node supplied with power supply voltage VDDQ and driver power supply line 11, and pull-down transistor 21 connected between driver power supply line 11 and the ground node. The gate of pull-down transistor 21 is connected to the power supply node supplied with a power supply voltage VDDP. Other structures of resistance element 20 and pull-down transistor 21 are the same as those in the first embodiment.

Word line driver WDR includes P- and N-channel MOS transistors PQ11 and NQ11. P- and N-channel MOS transistors PQ11 and NQ11 form a CMOS inverter.

Memory cell MC is supplied with a power supply voltage VDDM. Thus, power supply voltage VDDM is supplied to high-side power supply node VH shown in FIG. 2.

Assuming that resistance element 20 has a resistance value of R and pull-down transistor 21 has an on-resistance of Rn, a potential Vwl of word line WL can be expressed by the following equation:

$$Vwl=(Rn/(R+Rn)) \times VDDQ$$

In the semiconductor memory device according to the tenth embodiment of the invention, power supply voltage VDDQ is larger than power supply voltage VDDM.

When pull-down transistor 21 is in the slow state, the potential of word line WL can be set to the level equal to or higher than power supply voltage VDDM of memory cell MC so that it is possible to prevent lowering of the speed of access to memory cell MC.

Other structures and operations are the same as those of the first embodiment, and therefore detailed description thereof is not repeated.

Eleventh Embodiment

Figure 31:
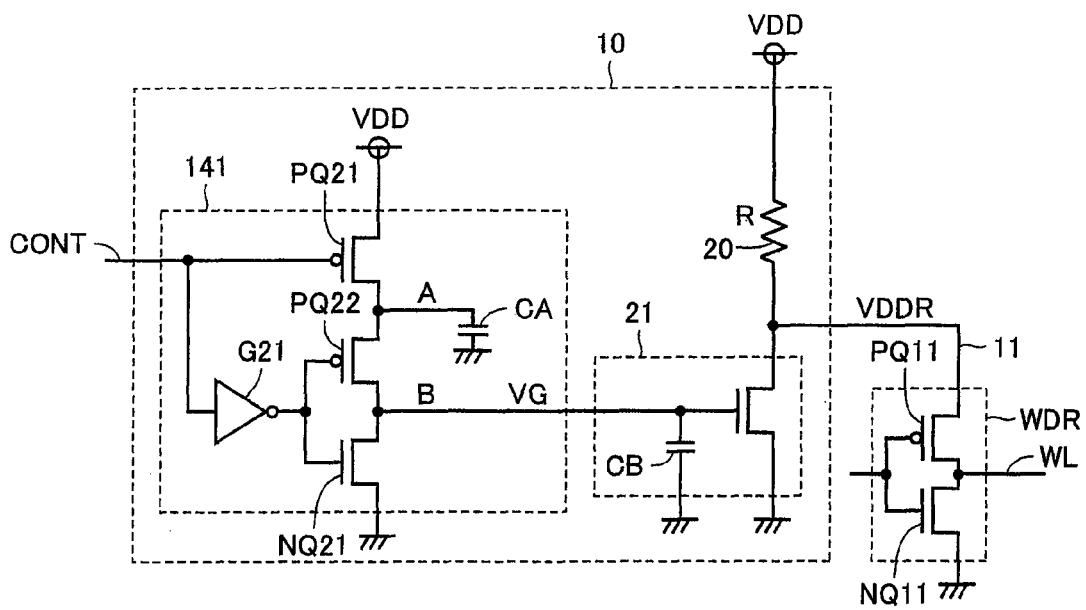
Figure 32:
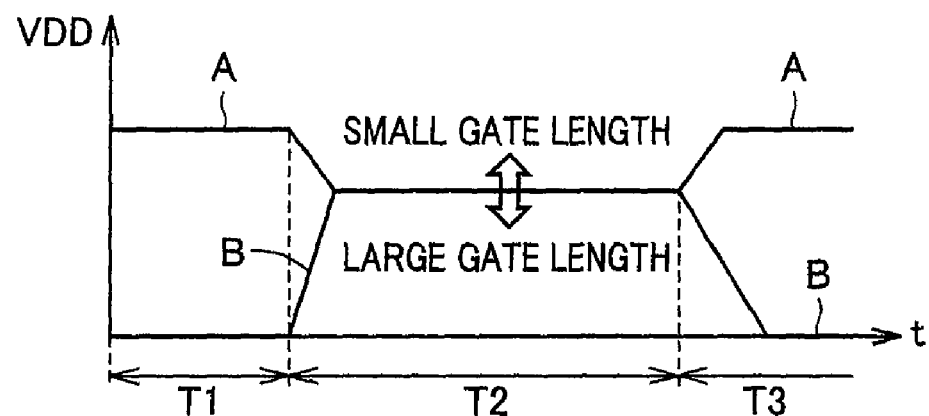
FIG. 32 is a graph illustrating potentials of nodes A and B in a gate control circuit 141.

FIG. 31 shows a major structure of a semiconductor memory device according to an eleventh embodiment of the invention. FIG. 32 is a graph illustrating potentials of nodes A and B in a gate control circuit 141.

In FIG. 31, the semiconductor memory device includes driver power supply circuit 10, word line driver WDR and gate control circuit 141.

In the structure shown in FIG. 32, pull-down transistor 21 and gate control circuit 141 form a pull-down circuit.

Gate control circuit 141 includes P-channel MOS transistors PQ21 and PQ22, an N-channel MOS transistor NQ21, an inverter G21 and a capacitor CA. Capacitor CA may be an interconnection capacitance.

A control signal CONT is supplied to a gate of P-channel MOS transistor PQ21 and an input terminal of inverter G21. A source of P-channel MOS transistor PQ21 is connected to the power supply node supplied with power supply voltage VDD. A drain of P-channel MOS transistor PQ21 is connected to a first end of capacitor CA and a source of P-channel MOS transistor PQ22. A drain of P-channel MOS transistor PQ22 is connected to the gate of pull-down transistor 21 and a drain of N-channel MOS transistor NQ21. An output terminal of inverter G21 is connected to a gate of P-channel MOS transistor PQ22 and a gate of N-channel MOS transistor NQ21. A source of N-channel MOS transistor NQ21 and a second end of capacitor CA are connected to the ground node supplied with the ground voltage.

The node connected to the drain of P-channel MOS transistor PQ21, the first end of capacitor CA and the source of P-channel MOS transistor PQ22 is referred to as a "node A" hereinafter. The node connected to the drain of P-channel MOS transistor PQ22, the drain of N-channel MOS transistor NQ21 and the gate of pull-down transistor 21 is referred to as a "node B" hereinafter. A capacitance CB is a gate capacitance of pull-down transistor 21.

Gate control circuit 141 electrically connects nodes A and B, i.e., the first end of capacitor CA and the gate of pull-down transistor 21 together when corresponding word line WL is selected, and thereby discharges electric charges accumulated in capacitor CA to the gate of pull-down transistor 21.

More specifically, when control signal CONT is at the logical L-level in FIG. 32, P-channel MOS transistor PQ21 is turned on, P-channel MOS transistor PQ22 is turned off and N-channel MOS transistor NQ21 is turned on. Thereby, capacitor CA is charged, and node A has the potential of power supply voltage VDD. Also, node B has the potential of the ground voltage level (section T1).

When control signal CONT attains the logical H-level thereafter, P-channel MOS transistor PQ21 is turned off, P-channel MOS transistor PQ22 is turned on and N-channel MOS transistor NQ21 is turned off. Thereby, nodes A and B are short-circuited so that the potentials of nodes A and B take values corresponding to a capacitance ratio between capacitances CA and CB (section T2).

When control signal CONT attains the logical L-level, P-channel MOS transistor PQ21 is turned on, P-channel MOS transistor PQ22 is turned off and N-channel MOS transistor NQ21 is turned on. Thereby, capacitor CA is charged, and node A attains the potential of power supply voltage VDD. Also, node B attains the potential at the ground voltage level (section T3).

When the gate length of pull-down transistor 21 decreases due to manufacturing variations, the threshold voltage decreases. In this case, gate capacitance. CB of pull-down transistor 21 decreases. Thereby, the potential of node B corresponding to the capacitance ratio between capacitors CA and CB increases, and the overdrive voltage of pull-down transistor 21 increases. The on-resistance of pull-down transistor 21 decreases, the drive capability thereof increases and the source potential of P-channel MOS transistor PQ11 decreases so that the potential of word line WL decreases.

When the gate length of pull-down transistor 21 increases due to the manufacturing variations, the threshold voltage increases. In this case, gate capacitance CB of pull-down transistor 21 increases. Thereby, the potential of node B corresponding to the capacitance ratio between capacitances CA and CB decreases, and the overdrive voltage of pull-down transistor 21 decreases. The on-resistance of pull-down transistor 21 increases, the drive capability thereof decreases and the source potential of P-channel MOS transistor PQ11 increases so that the potential on word line WL increases.

Therefore, the semiconductor memory device according to the eleventh embodiment of the invention can appropriately adjust the potential of word line WL according to the variations in gate length of pull-down transistor 21 so that the data writing and data reading can be stably performed.

Other structures and operations are the same as those of the first embodiment, and therefore detailed description thereof is not repeated.

Twelfth Embodiment

Figure 33:
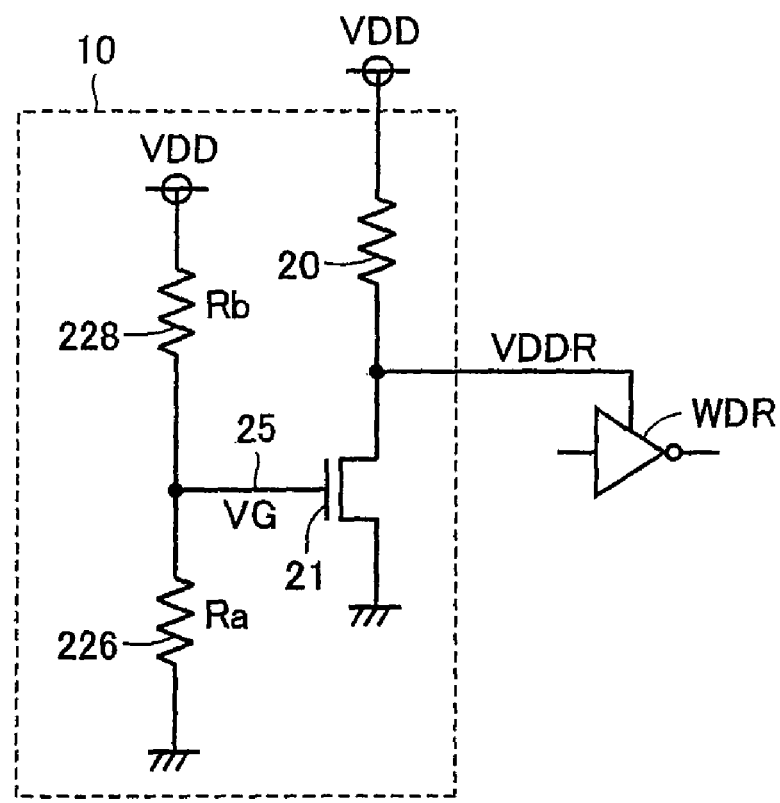
FIG. 33 shows a major structure of a semiconductor memory device according to a twelfth embodiment of the invention.

FIG. 33 shows a major structure of a semiconductor memory device according to a twelfth embodiment of the invention.

In FIG. 33, driver power supply circuit 10 includes resistance elements 20, 226 and 228 as well as pull-down transistor 21.

Similarly to the structure of the first embodiment shown in FIG. 8, resistance elements 226 and 228 are heavily doped N-type polycrystalline silicon non-silicide resistance element having the line width equal to width (channel length) L of gate electrode G.

In the structure shown in FIG. 33, resistance elements 226 and 228 as well as pull-down transistor 21 form a pull-down circuit.

It is now assumed that the memory cell transistor has small gate length (channel length) L. In this case, threshold voltage Vthn of the N-channel MOS transistor in memory cell MC lowers. The interconnection width of resistance element 226 decreases so that resistance value Ra thereof increases. Therefore, the voltage level of gate voltage VG on internal node 25 rises. Thereby, the conductance of pull-down transistor 21 increases, and the drive power supply voltage VDDR lowers.

Therefore, threshold voltage Vthn of the access or drive transistor in memory cell MC lowers so that the voltage transmitted onto the selected word line can be lowered.

Then, it is assumed that the transistor in memory cell MC has large gate length (channel length) L. In this case, the threshold voltage of the access or drive transistor in memory cell MC increases. In resistance element 226, the interconnection width increases, and the resistance value lowers. Therefore, the voltage level of gate voltage VG on internal node 25 lowers, and the conductance of pull-down transistor 21 lowers. Thereby, the voltage level of driver power supply voltage VDDR rises. Therefore, when the threshold voltage of the access or drive transistor in memory cell MC increases according to increase in channel length thereof, the voltage level of selected word line can be increased.

Therefore, the gate potential of pull-down transistor 21 can be adjusted according to the variations in threshold voltage of the access or drive transistor in memory cell MC, and driver power supply voltage VDDR can be adjusted in the direction not deteriorating the write characteristics and the read current.

Further, each of resistance elements 226 and 228 is the N-type doped polycrystalline silicon non-silicide resistor. Therefore, resistance elements 226 and 228 have the resistance values that vary to the extents equal to each other. Since voltage VG on internal node 25 depends on the resistance ratio between resistance elements 226 and 228, it is possible to prevent deviation of voltage VG on internal node 25 from the optimum value that may occur due to variations in resistance elements 226 and 228.

In the fourth embodiment already described, resistance element 28 corresponding to resistance element 228 is formed of the diffusion resistor. For example, when channel width W of pull-down transistor 21 increases and the threshold voltage equivalently decreases, the correction is therefore performed to raise voltage VG on internal node 25. Thereby, it is possible to reduce the influence that may be exerted on driver power supply voltage VDDR by the variations in threshold voltage of pull-down transistor 21.

However, when the influence of reverse narrow effect is large in pull-down transistor 21, the threshold voltage of pull-down transistor 21 increases with increase in channel width W thereof so that the correction effect achieved by employing the diffusion resistor as resistance element 28 is small. In this case, the structure of this twelfth embodiment employing the N-type doped polycrystalline silicon non-silicide resistor as resistance element 228 is effective.

Figure 34:
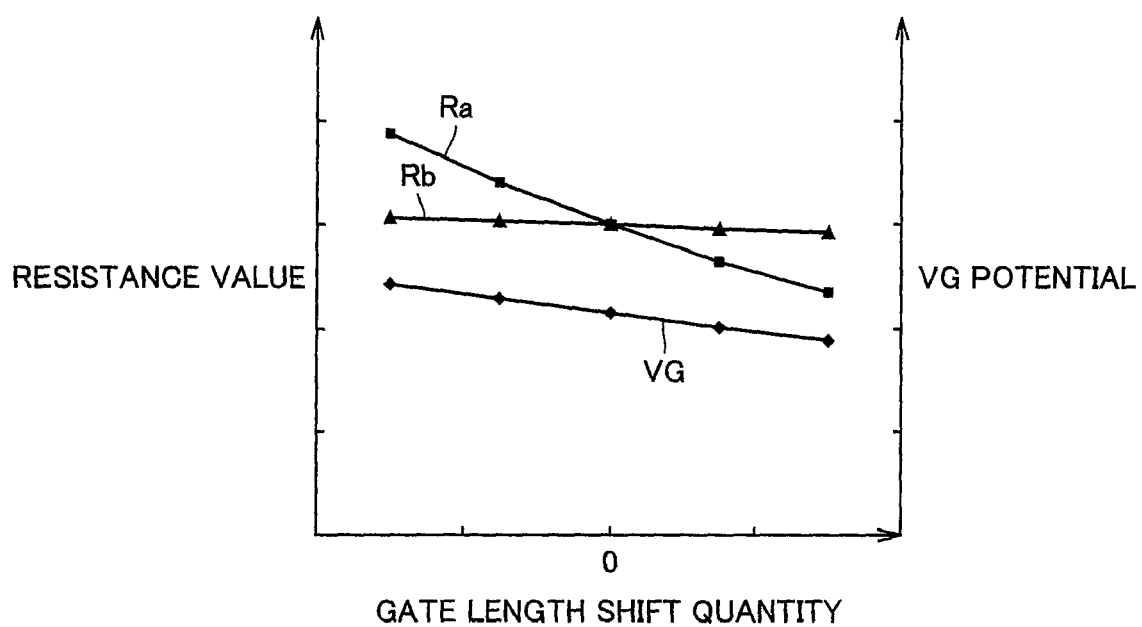
FIG. 34 is a graph illustrating a relationship between a shift quantity of a gate length of a pull-down transistor 21 with respect to resistance values of resistance elements 226 and 228 as well as a voltage VG on an internal node 25.

FIG. 34 is a graph illustrating a relationship of a shift quantity of the gate length of pull-down transistor 21 with respect to the resistance values of resistance elements 226 and 228 as well as voltage VG on internal node 25.

In this twelfth embodiment, resistance element 228 has a larger interconnection width than resistance element 226. Assuming that resistance element 226 has a resistance value of Ra and resistance element 228 has a resistance value of Rb, voltage VG on internal node 25 can be expressed by the following equation:

$$VG = \frac{Ra}{Ra+Rb} \times VDD$$

Assuming that R represents the resistance value, l represents the interconnection length of the resistance and L represents the interconnection width of the resistance, the relationship of $(R = \rho \times l / L)$ is present. Therefore, voltage VG on internal node 25 can be expressed by the following equation, where la and lb represent the interconnection lengths of resistance elements 226 and 228, respectively, and La and Lb represent the interconnection widths of resistance elements 226 and 228, respectively.

$$VG = \frac{\rho \times \frac{la}{La}}{\rho \times \frac{la}{La} + \rho \times \frac{lb}{Lb}} \times VDD = \frac{1}{1 + \frac{lb}{la} + \frac{La}{Lb}} \times VDD$$

It is assumed that relationships of (Lb=m×La) and (lb=n×la) are present. When a variation of d occurs in the gate length of pull-down transistor 21, a voltage VGD on internal node 25 is expressed by the following equation:

$$VGD = \frac{1}{1 + \frac{n \times la}{la} \times \frac{La+d}{m \times La+d}} \times VDD$$

Therefore, the quantity of change in voltage VG on internal node 25 that is caused by the variations in gate length of pull-down transistor 21 can be expressed by the following equation:

$$\frac{VGD}{VG} = \frac{1 + \frac{n \times la}{la} \times \frac{La+d}{m \times La+d}}{1 + \frac{n \times la}{la} \times \frac{La}{m \times La}}$$

$$= 1 - \frac{n}{m} \times \frac{(m-1)}{(m+n) \times La + (n+1) \times d} \times d$$

According to the above equation, even when interconnection width Lb of resistance element 228 is larger than interconnection width La of resistance element 226 (i.e., m>1) and the gate length of pull-down transistor 21 increases (i.e., d>0), voltage VGD on internal node 25 decreases. When the gate length of pull-down transistor 21 decreases (i.e., d<0), voltage VGD on internal node 25 increases.

The structure described above can improve the sensitivity to the variations in gate length of pull-down transistor 21.

Other structures and operations are the same as those of the first embodiment, and therefore detailed description thereof is not repeated.

In the present invention, driver power supply circuit 10 may be configured to further include a resistance element connected between driver power supply line 11 and pull-down element 21 and manufactured by the same process as resistance element 20. By such a structure, the effect caused by variation in the manufacture of resistance element 20 can be reduced.

By applying the invention to the static semiconductor memory device, it is possible to achieve the memory device that operates stably and fast even with a low power supply voltage. Particularly, when it is mounted on the same semiconductor chip as a logic such as another processor, as is done, e.g., in an SOC (System On Chip), it is possible to provide the memory system that operates stably with low power consumption under conditions of a low power supply voltage.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a plurality of static memory cells arranged in rows and columns, each memory cell including first and second load transistors, a first drive transistor coupled to the first load transistor at a first storage node, a second drive transistor coupled to the second load transistor at a second storage node, a first access transistor coupled to the first storage node and a second access transistor coupled to the second storage node;
a plurality of word lines provided corresponding to the rows, respectively, each word line coupled to the first and second access transistors of the memory cells in the corresponding row;
a plurality of bit line pairs provided corresponding to the columns, respectively, each bit line pair coupled to the first and second access transistors of the memory cells in the corresponding column;
a plurality of word line drivers coupled to the plurality of word lines, respectively, each word line driver driving the word line coupled thereto to a selected state;
a driver power supply line coupled commonly to the plurality of word line drivers and applying a driver power supply voltage to the plurality of word line drivers as respective operation voltages thereof;
a driver power supply circuit receiving a power supply voltage, which is higher than the driver power supply voltage, on a main power supply node and providing the driver power supply line with the drive power supply voltage,
the driver power supply circuit including:
a resistance element coupled between the main power supply node and a couple node, and applying a current flowing from the main power supply node to the couple node, and
a pull-down circuit coupled between the couple node and a ground node, and applying a current from the couple node to a ground node to step down a voltage on the couple node from the power supply voltage, the driver power supply circuit producing the driver power supply voltage based on the couple node.

2. The semiconductor device according to claim 1, wherein the pull-down circuit is so configured to allow an current quantity adjustment of the current flowing from the couple node to the ground node.

3. The semiconductor device according to claim 2, wherein the pull-down circuit includes a transistor coupled between the couple node and the ground node.

4. The semiconductor device according to claim 1, wherein the pull-down circuit includes a plurality of transistors coupled in parallel between the couple node and the ground node and having gate electrodes receiving distinct signals respectively.

5. A semiconductor device comprising:
a plurality of static memory cells arranged in rows and columns, each memory cell including first and second load transistors, first drive transistor coupled to the first load transistor at a first storage node, a second drive transistor coupled to the second load transistor at a second storage node, a first access transistor coupled to the first storage node and a second access transistor coupled to the second storage node;
a plurality of word lines provided corresponding to the rows, respectively, each word line coupled to the first and second access transistors of the memory cells in the corresponding row;
a plurality of bit line pairs provided corresponding to the columns, respectively, each bit line pair coupled to the first and second access transistors of the memory cells in the corresponding column;
a plurality of word line drivers coupled to the plurality of word lines, respectively, each word line driver driving the word line coupled thereto to a selected state;
a driver power supply line coupled commonly to the plurality of word line drivers and applying a driver power supply voltage to the plurality of word line drivers as respective operation voltages thereof;
a driver power supply circuit receiving a power supply voltage, which is higher than the driver power supply voltage, on a main power supply node and providing the driver power supply line with the drive power supply voltage,
the driver power supply circuit including:
a first element coupled between the main power supply node and a couple node, and applying a current flowing from the main power supply node to the couple node, and
a second element applying a current flowing from the couple node to an ground node and including a plurality of transistors coupled in parallel between the couple node and the ground node, and having gate electrodes receiving distinct signals respectively, at least one of the plurality of transistors being conductive to apply the current flowing from the couple node to the ground node,
the driver power supply circuit producing the driver power supply voltage based on the couple node.

6. The semiconductor device according to claim 5, wherein the first element includes a resistance element.

* * * * *